US012635186B2

(12) United States Patent
Cheng et al.

(10) Patent No.: US 12,635,186 B2
(45) Date of Patent: May 19, 2026

(54) MULTIGATE DEVICES WITH VARYING CHANNEL LAYERS

(71) Applicant: Taiwan Semiconductor Manufacturing Co., Ltd., Hsin-Chu (TW)

(72) Inventors: Kuan-Lun Cheng, Hsin-Chu (TW); Yu-Xuan Huang, Hsunchu (TW); Hou-Yu Chen, Hsinchu County (TW); Ching-Wei Tsai, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 459 days.

(21) Appl. No.: 17/354,085

(22) Filed: Jun. 22, 2021

(65) Prior Publication Data

US 2022/0052206 A1     Feb. 17, 2022

Related U.S. Application Data

(60) Provisional application No. 63/065,646, filed on Aug. 14, 2020.

(51) Int. Cl.
 *H10D 30/67*        (2025.01)
 *H01L 21/02*        (2006.01)
  (Continued)

(52) U.S. Cl.
 CPC ..... *H10D 30/6757* (2025.01); *H01L 21/0259* (2013.01); *H01L 23/5286* (2013.01);
  (Continued)

(58) Field of Classification Search
 CPC ......... H01L 29/42392; H01L 29/66553; H01L 21/823864; H01L 21/0259; H01L 23/5286;
  (Continued)

(56) References Cited

U.S. PATENT DOCUMENTS 10,020,261 B2    7/2018  Wu et al.
10,243,054 B1 *  3/2019  Cheng .................. H10D 30/014
  (Continued)

FOREIGN PATENT DOCUMENTS

CN        109906513 A     6/2019
CN        110970424 A     4/2020
  (Continued)

*Primary Examiner* — Matthew C Landau
*Assistant Examiner* — Halee Cramer
(74) *Attorney, Agent, or Firm* — HAYNES AND BOONE, LLP

(57)        ABSTRACT

Multigate devices and methods for fabricating such are disclosed herein. An exemplary multigate device includes a first FET disposed in a first region; and a second FET disposed in a second region of a substrate. The first FET includes first channel layers disposed over the substrate, and a first gate stack disposed on the first channel layers and extended to warp around each of the first channel layers. The second FET includes second channel layers disposed over the substrate, and a second gate stack disposed on the second channel layers and extended to warp around each of the second channel layers. A number of the first channel layers is greater than a number of the second channel layers. A bottommost one of the first channel layers is below a bottommost one of the second channel layers.

20 Claims, 28 Drawing Sheets

(51) Int. Cl.

| | |
|---|---|
| *H01L 23/528* | (2006.01) |
| *H10D 30/01* | (2025.01) |
| *H10D 62/10* | (2025.01) |
| *H10D 64/01* | (2025.01) |
| *H10D 84/01* | (2025.01) |
| *H10D 84/03* | (2025.01) |
| *H10D 84/85* | (2025.01) |

(52) U.S. Cl.
CPC ....... *H10D 30/031* (2025.01); *H10D 30/6713* (2025.01); *H10D 30/6729* (2025.01); *H10D 30/6735* (2025.01); *H10D 62/118* (2025.01); *H10D 64/017* (2025.01); *H10D 64/018* (2025.01); *H10D 84/0167* (2025.01); *H10D 84/017* (2025.01); *H10D 84/0184* (2025.01); *H10D 84/0186* (2025.01); *H10D 84/038* (2025.01); *H10D 84/85* (2025.01)

(58) Field of Classification Search
CPC ........... H10D 30/6757; H10D 30/6713; H10D 30/6735; H10D 64/017
See application file for complete search history.

(56) References Cited

U.S. PATENT DOCUMENTS

| | | | | |
|---|---|---|---|---|
| 10,263,100 | B1 * | 4/2019 | Bi | H10D 62/364 |
| 10,269,715 | B2 | 4/2019 | Wu et al. | |
| 10,282,504 | B2 | 5/2019 | Wu et al. | |
| 2015/0069328 | A1 * | 3/2015 | Leobandung | H10D 62/116 |
| | | | | 438/151 |
| 2017/0365661 | A1 * | 12/2017 | Doris | H10D 30/025 |
| 2017/0373163 | A1 * | 12/2017 | Vellianitis | H10D 30/6741 |
| 2020/0006333 | A1 * | 1/2020 | Noh | H10D 62/116 |
| 2020/0105756 | A1 | 4/2020 | Crum | |
| 2020/0161339 | A1 | 5/2020 | Lee | |
| 2020/0219970 | A1 | 7/2020 | Mannebach | |
| 2020/0357884 | A1 * | 11/2020 | Xie | H10D 30/6735 |
| 2021/0202696 | A1 * | 7/2021 | Guha | H01L 21/02532 |

FOREIGN PATENT DOCUMENTS

| | | | |
|---|---|---|---|
| DE | 102021112552 | A1 | 12/2021 |
| KR | 20150022905 | A | 3/2015 |
| KR | 20170041605 | A | 4/2017 |
| KR | 20170100739 | A | 9/2017 |
| KR | 20170102660 | A | 9/2017 |
| KR | 20190015269 | A | 2/2019 |
| KR | 20200002277 | A | 1/2020 |
| TW | 201729300 | A | 8/2017 |

* cited by examiner

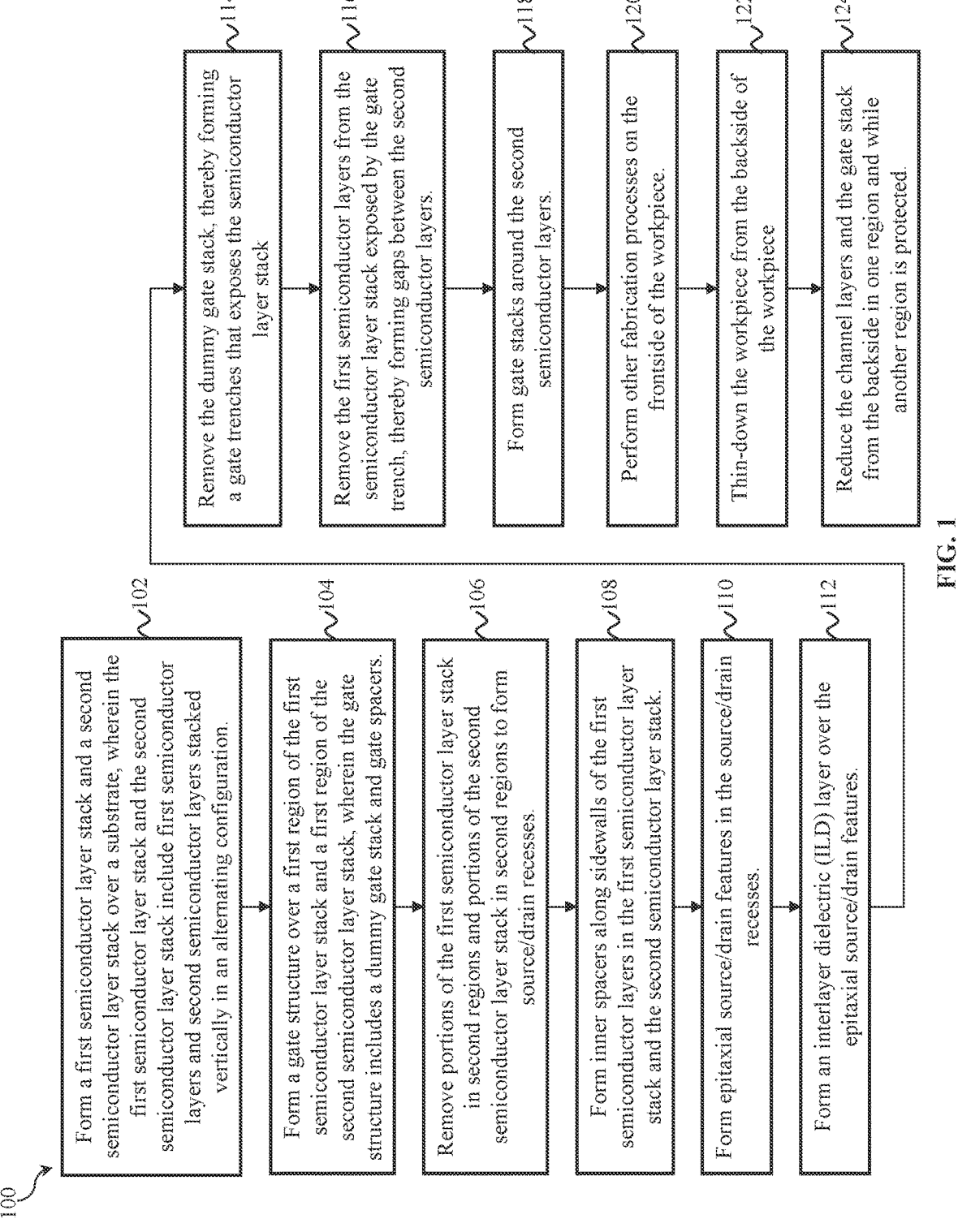

100

Form a first semiconductor layer stack and a second semiconductor layer stack over a substrate, wherein the first semiconductor layer stack and the second semiconductor layer stack include first semiconductor layers and second semiconductor layers stacked vertically in an alternating configuration. — 102

Form a gate structure over a first region of the first semiconductor layer stack and a first region of the second semiconductor layer stack, wherein the gate structure includes a dummy gate stack and gate spacers. — 104

Remove portions of the first semiconductor layer stack in second regions and portions of the second semiconductor layer stack in second regions to form source/drain recesses. — 106

Form inner spacers along sidewalls of the first semiconductor layers in the first semiconductor layer stack and the second semiconductor layer stack. — 108

Form epitaxial source/drain features in the source/drain recesses. — 110

Form an interlayer dielectric (ILD) layer over the epitaxial source/drain features. — 112

Remove the dummy gate stack, thereby forming a gate trenches that exposes the semiconductor layer stack — 114

Remove the first semiconductor layers from the semiconductor layer stack exposed by the gate trench, thereby forming gaps between the second semiconductor layers. — 116

Form gate stacks around the second semiconductor layers. — 118

Perform other fabrication processes on the frontside of the workpiece. — 120

Thin-down the workpiece from the backside of the workpiece — 122

Reduce the channel layers and the gate stack from the backside in one region and while another region is protected. — 124

FIG. 1

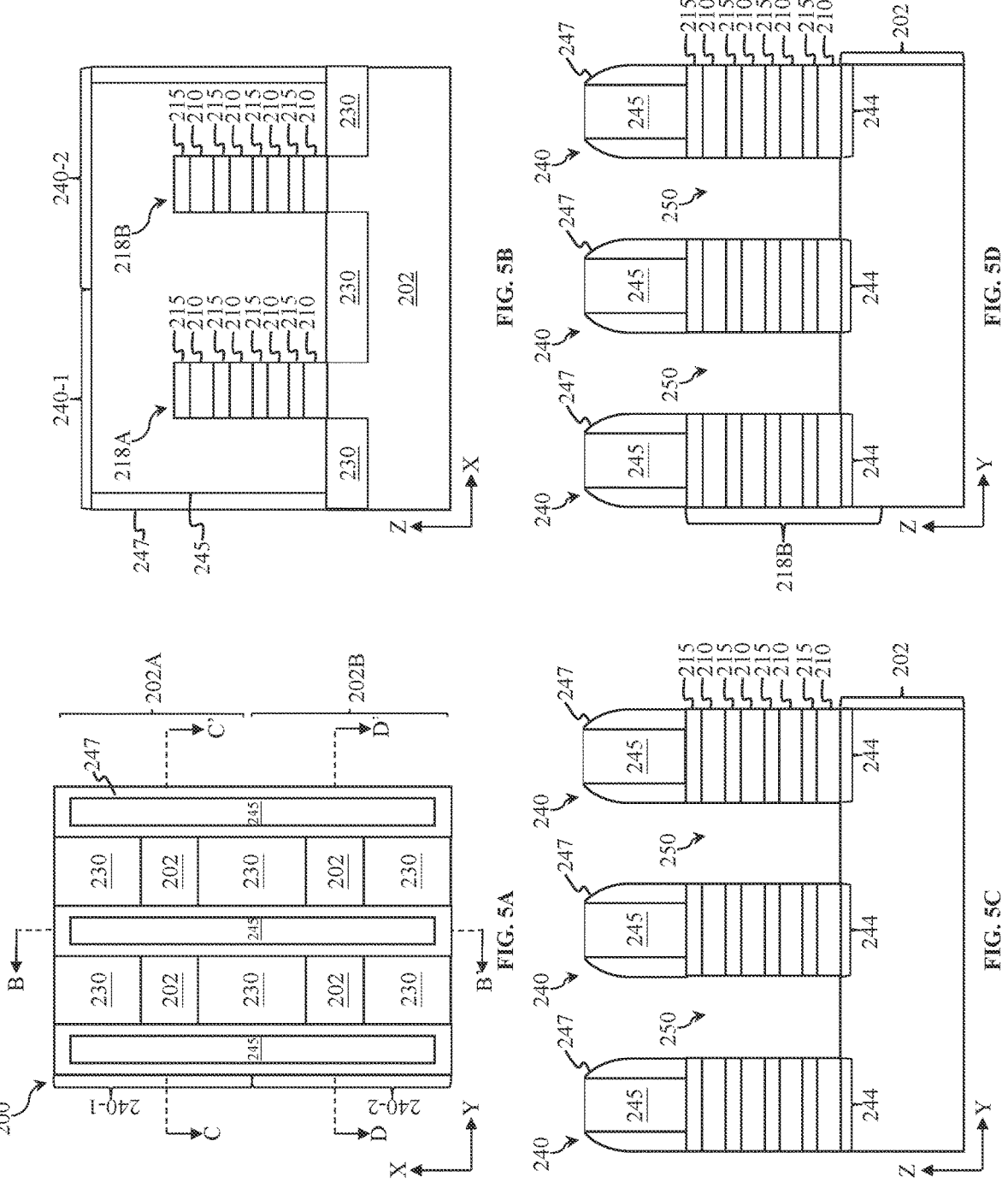

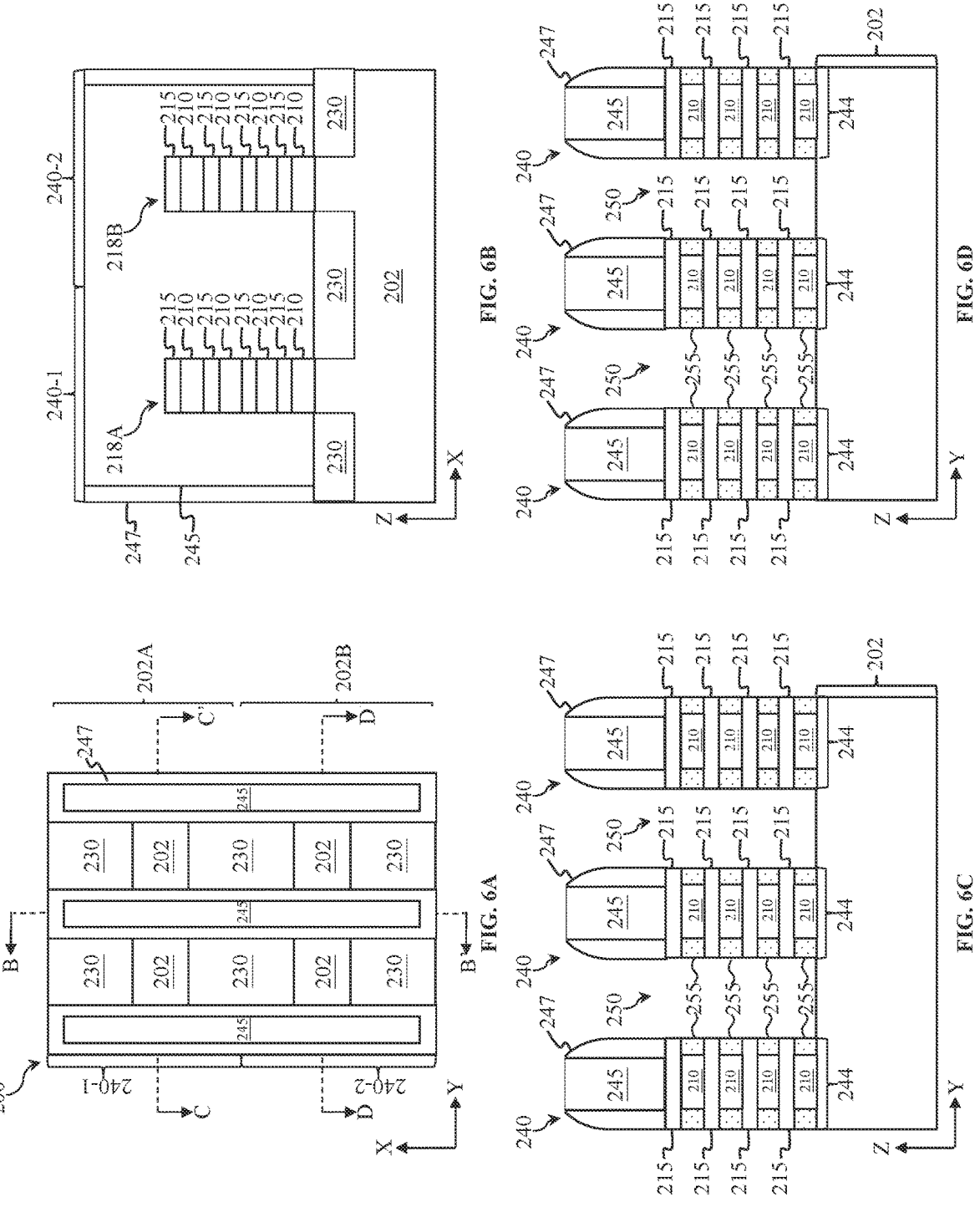

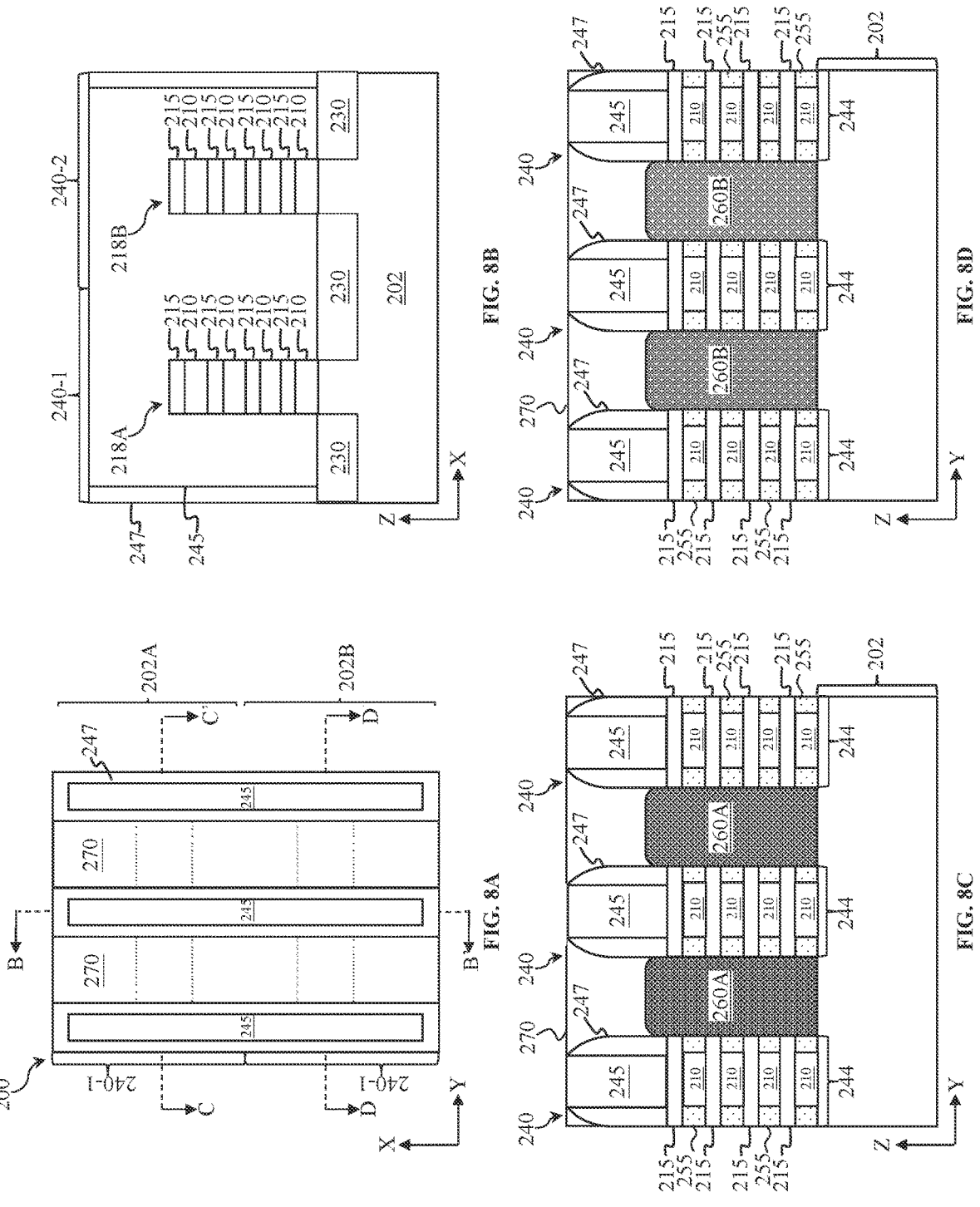

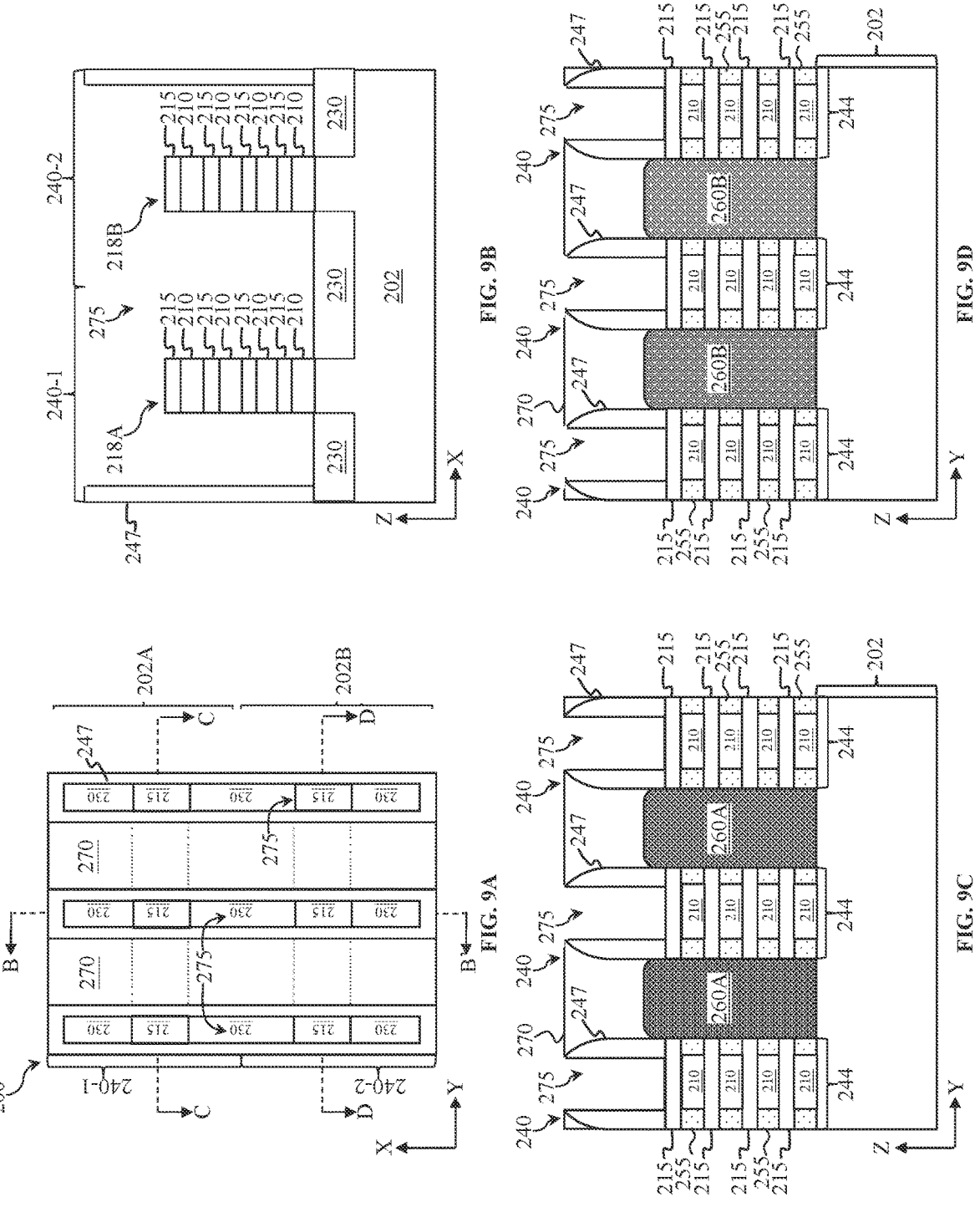

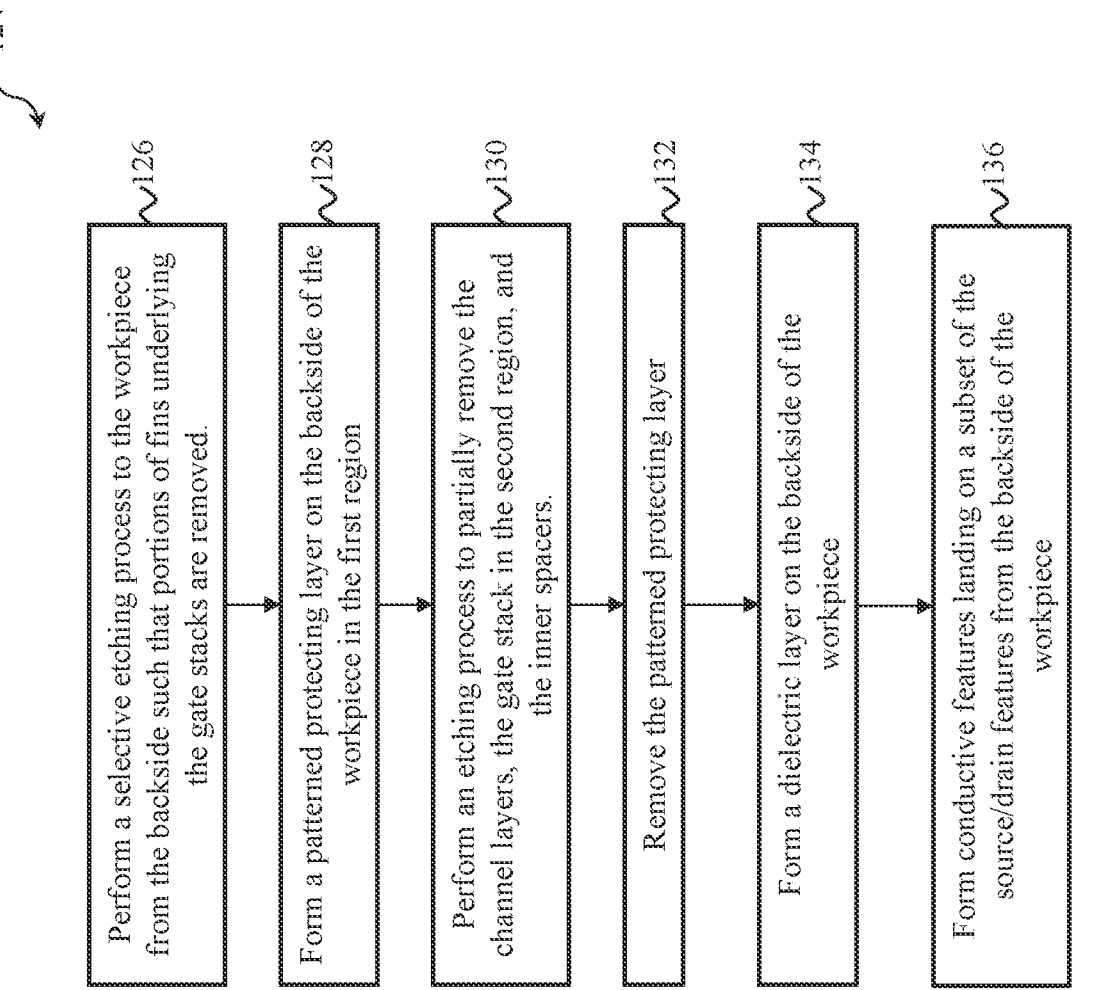

124

126 — Perform a selective etching process to the workpiece from the backside such that portions of fins underlying the gate stacks are removed.

128 — Form a patterned protecting layer on the backside of the workpiece in the first region 130 — Perform an etching process to partially remove the channel layers, the gate stack in the second region, and the inner spacers.

132 — Remove the patterned protecting layer

134 — Form a dielectric layer on the backside of the workpiece

136 — Form conductive features landing on a subset of the source/drain features from the backside of the workpiece

FIG. 13

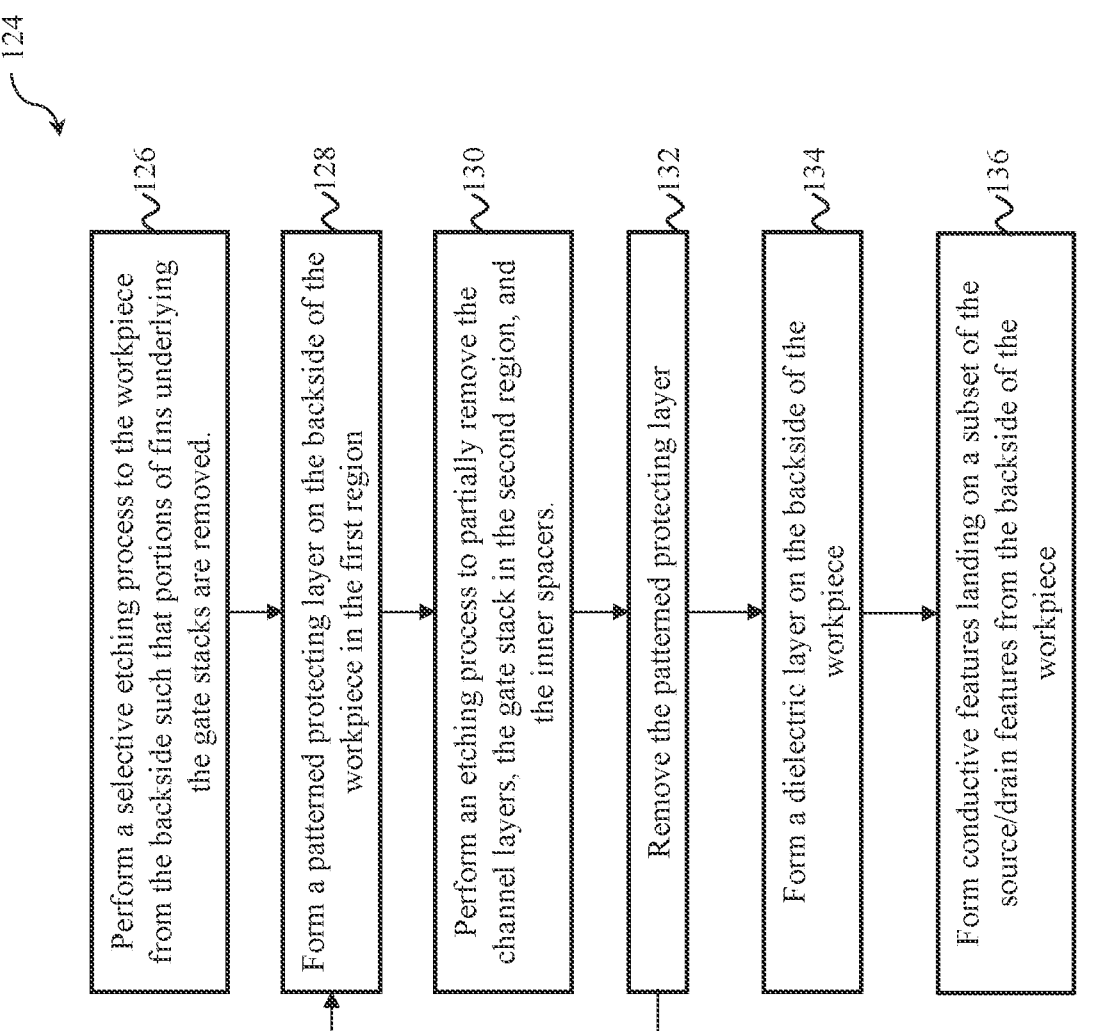

124

Perform a selective etching process to the workpiece from the backside such that portions of fins underlying the gate stacks are removed. — 126

Form a patterned protecting layer on the backside of the workpiece in the first region — 128

Perform an etching process to partially remove the channel layers, the gate stack in the second region, and the inner spacers. — 130

Remove the patterned protecting layer — 132

Form a dielectric layer on the backside of the workpiece — 134

Form conductive features landing on a subset of the source/drain features from the backside of the workpiece — 136

FIG. 25

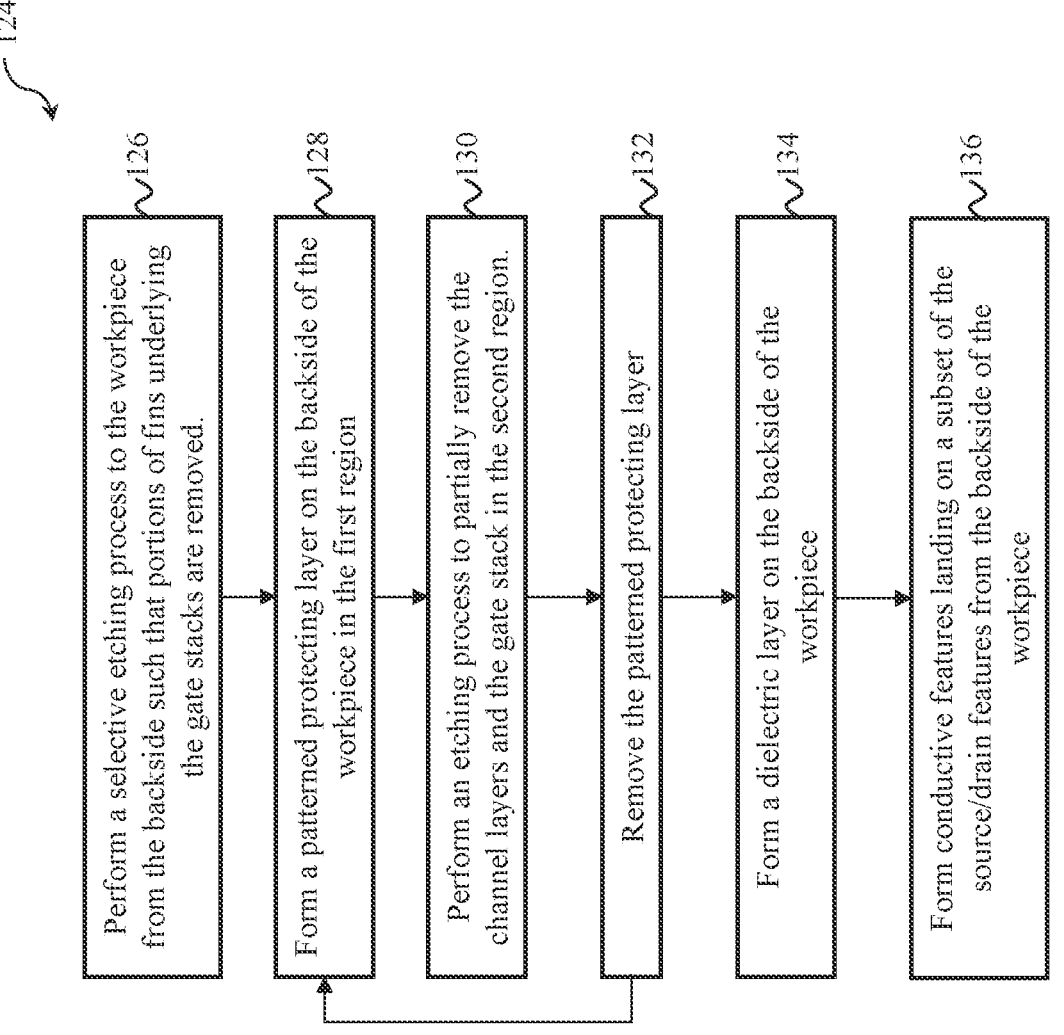

124

Perform a selective etching process to the workpiece from the backside such that portions of fins underlying the gate stacks are removed. ~126

Form a patterned protecting layer on the backside of the workpiece in the first region ~128

Perform an etching process to partially remove the channel layers and the gate stack in the second region. ~130

Remove the patterned protecting layer ~132

Form a dielectric layer on the backside of the workpiece ~134

Form conductive features landing on a subset of the source/drain features from the backside of the workpiece ~136

FIG. 27

MULTIGATE DEVICES WITH VARYING CHANNEL LAYERS

PRIORITY DATA

This application claims priority to U.S. Provisional Patent Application No. 63/065,646 filed on Aug. 14, 2020, entitled "STRUCTURE AND METHOD FOR MULTI-CHANNEL WITH BACKSIDE POWER RAIL", the entire disclosure of which is hereby incorporated herein by reference.

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes. Thus, realizing continued advances in IC devices and their performance requires similar advances in IC manufacturing processes and technology.

Recently, multigate devices have been introduced to improve gate control. Multigate devices have been observed to increase gate-channel coupling, reduce OFF-state current, and/or reduce short-channel effects (SCEs). One such multigate device is the gate-all around (GAA) device, which includes a gate structure that can extend, partially or fully, around a channel region to provide access to the channel region on at least two sides. GAA devices enable aggressive scaling down of IC technologies, maintaining gate control and mitigating SCEs, while seamlessly integrating with conventional IC manufacturing processes. As GAA devices continue to scale, challenges have arisen when integrating various devices together, which challenges have been observed to degrade power efficiency and GAA device performance and increase GAA processing complexity including battery size. Accordingly, although existing GAA devices and methods for fabricating such have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1 is a flowchart of a method for fabricating a multigate device according to various aspects of the present disclosure.

FIGS. 2A-12A, FIGS. 2B-12B, FIGS. 2C-12C, and FIGS. 2D-12D are fragmentary diagrammatic views of a multigate device, in portion or entirety, at various fabrication stages (such as those associated with the method in FIG. 1) according to various aspects of the present disclosure.

FIG. 13 is a flowchart of a method for fabricating a multigate device according to various aspects of the present disclosure.

FIGS. 14A-21A, FIGS. 14B-21B, FIGS. 14C-21C, and FIGS. 14D-21D are fragmentary diagrammatic views of a multigate device, in portion or entirety, at various fabrication stages (such as those associated with the method in FIG. 13) according to various aspects of the present disclosure.

FIGS. 23A-24A, FIGS. 23B-24B, FIGS. 23C-24C, and FIGS. 23D-24D are fragmentary diagrammatic views of a multigate device, in portion or entirety, at various fabrication stages (such as those associated with the method in FIG. 22) according to various aspects of the present disclosure.

FIG. 25 is a flow chart of a method for fabricating a multigate device according to various aspects of the present disclosure.

FIG. 27 is a flow chart of a method for fabricating a multigate device according to various aspects of the present disclosure.

DETAILED DESCRIPTION

Figures 2A, 2B, 2C, 2D:
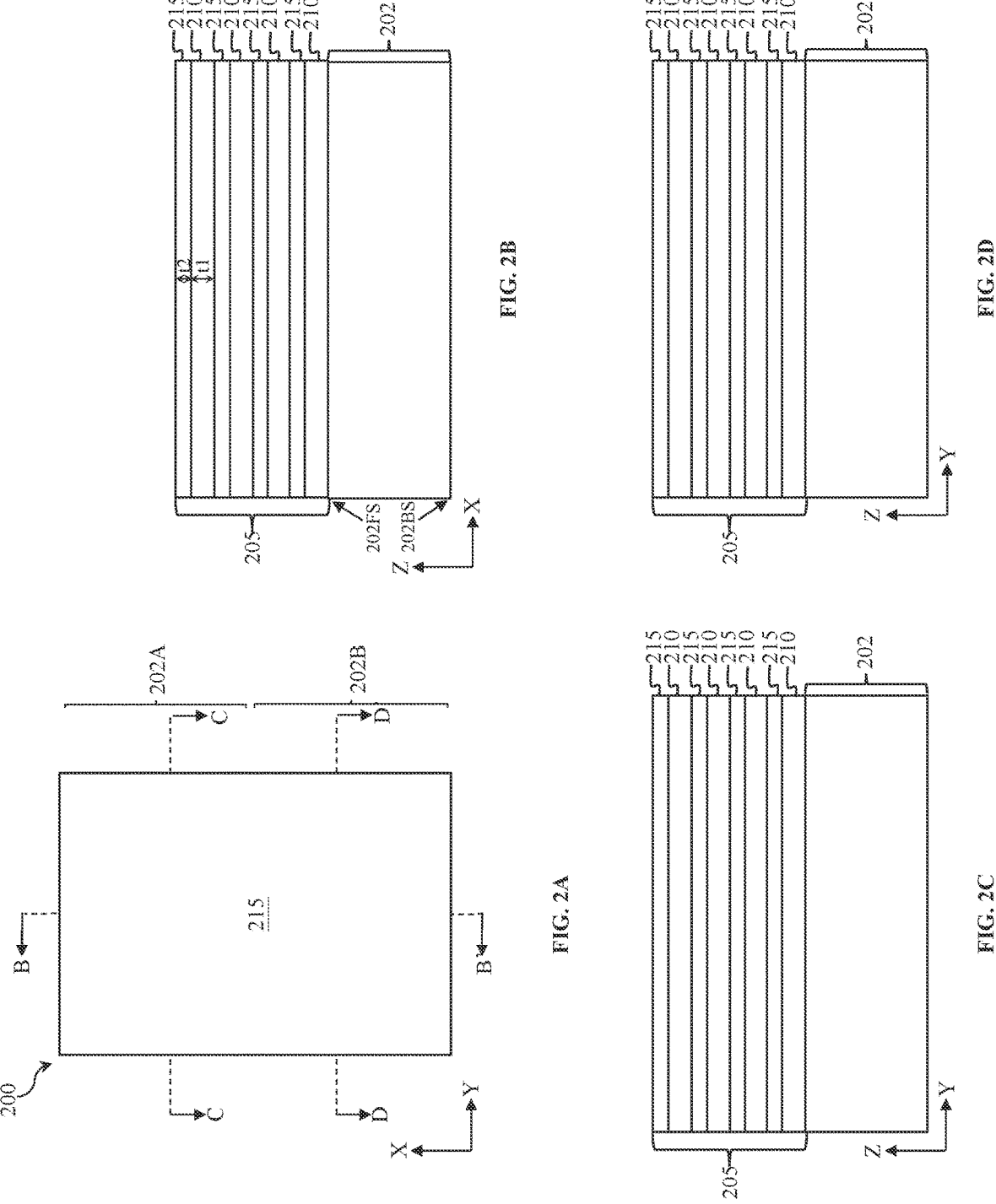
Figures 3A, 3B, 3C, 3D:
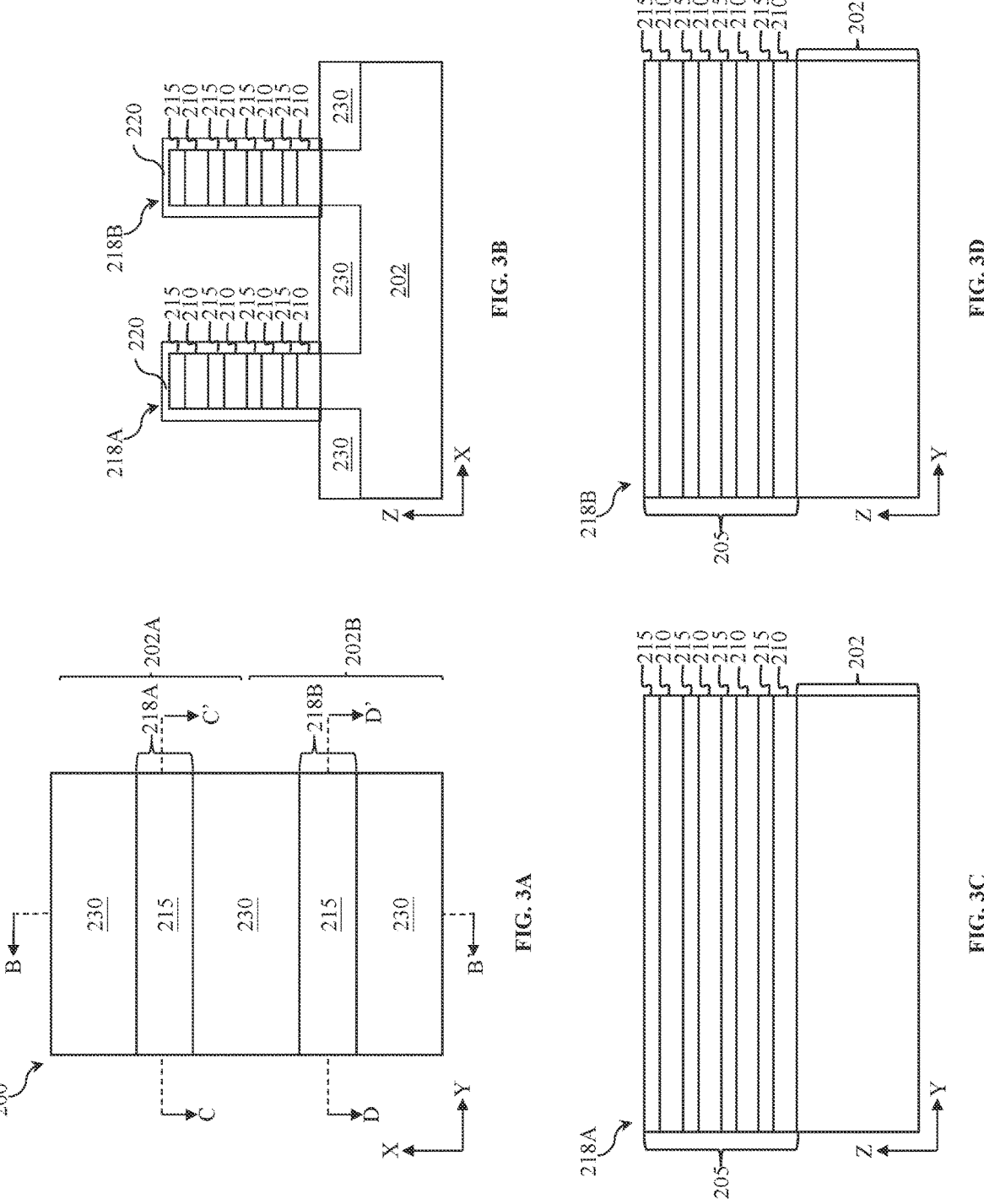
Figures 4A, 4B, 4C, 4D:
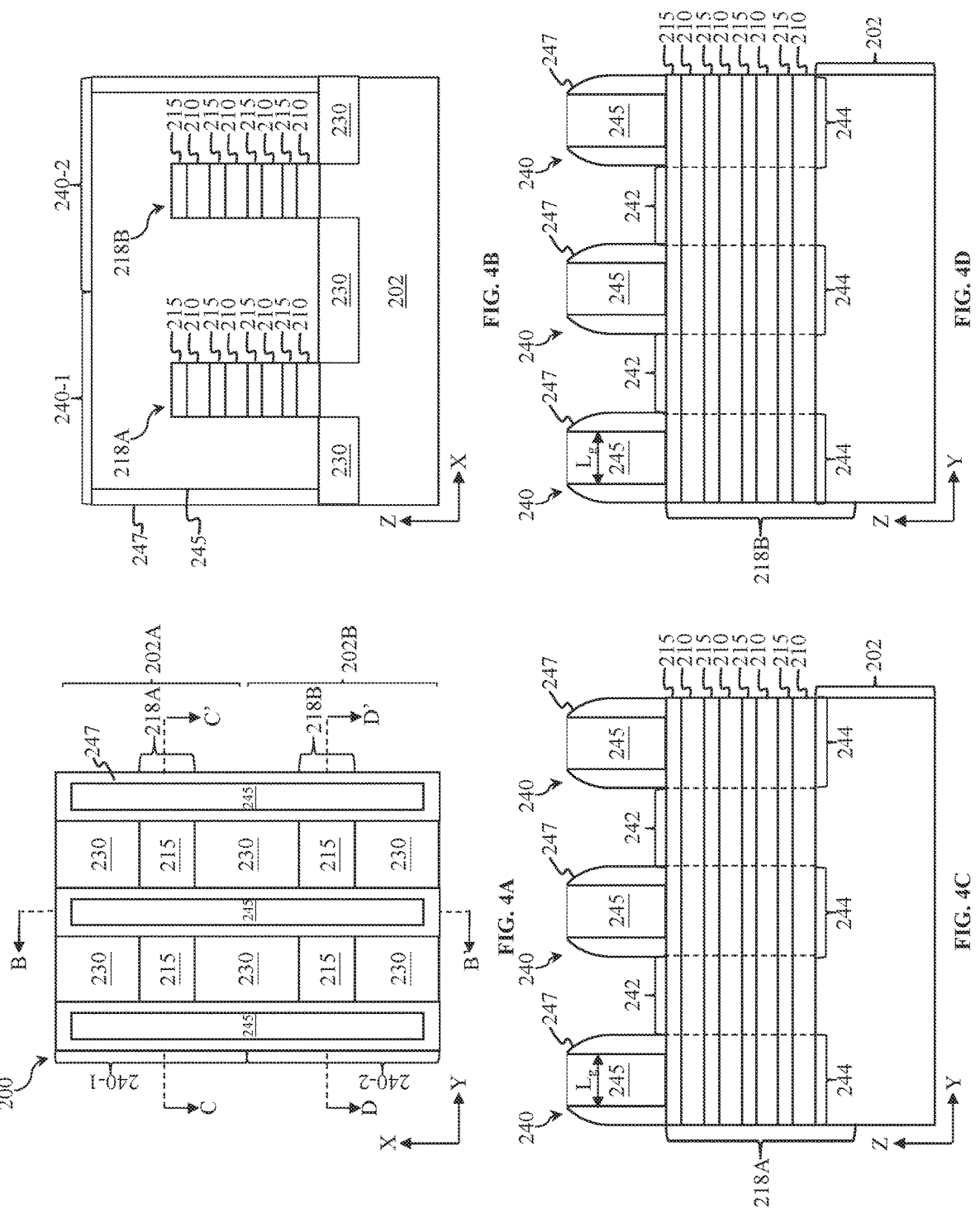
Figures 7A, 7B, 7C, 7D:
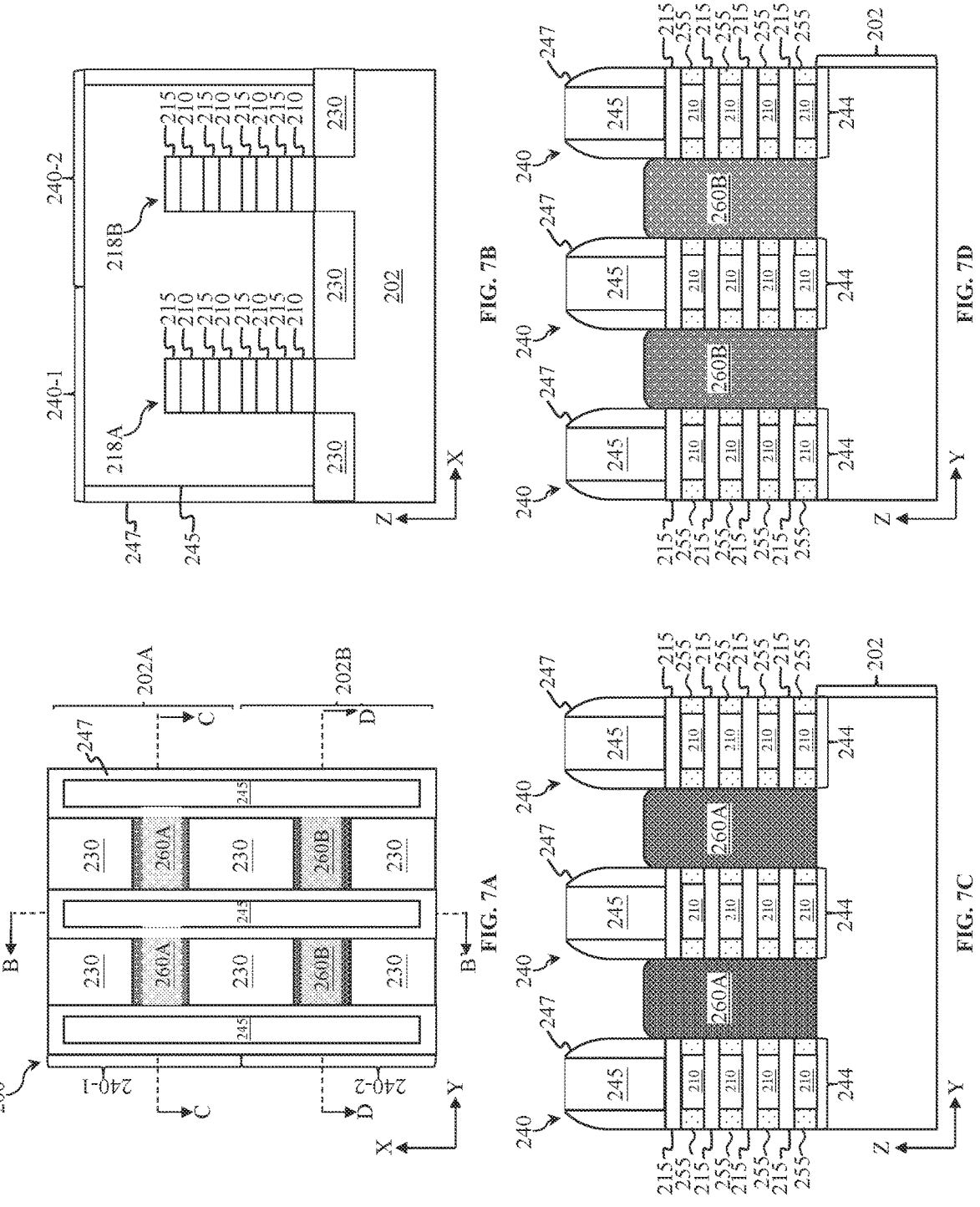
Figures 10A, 10B, 10C, 10D:
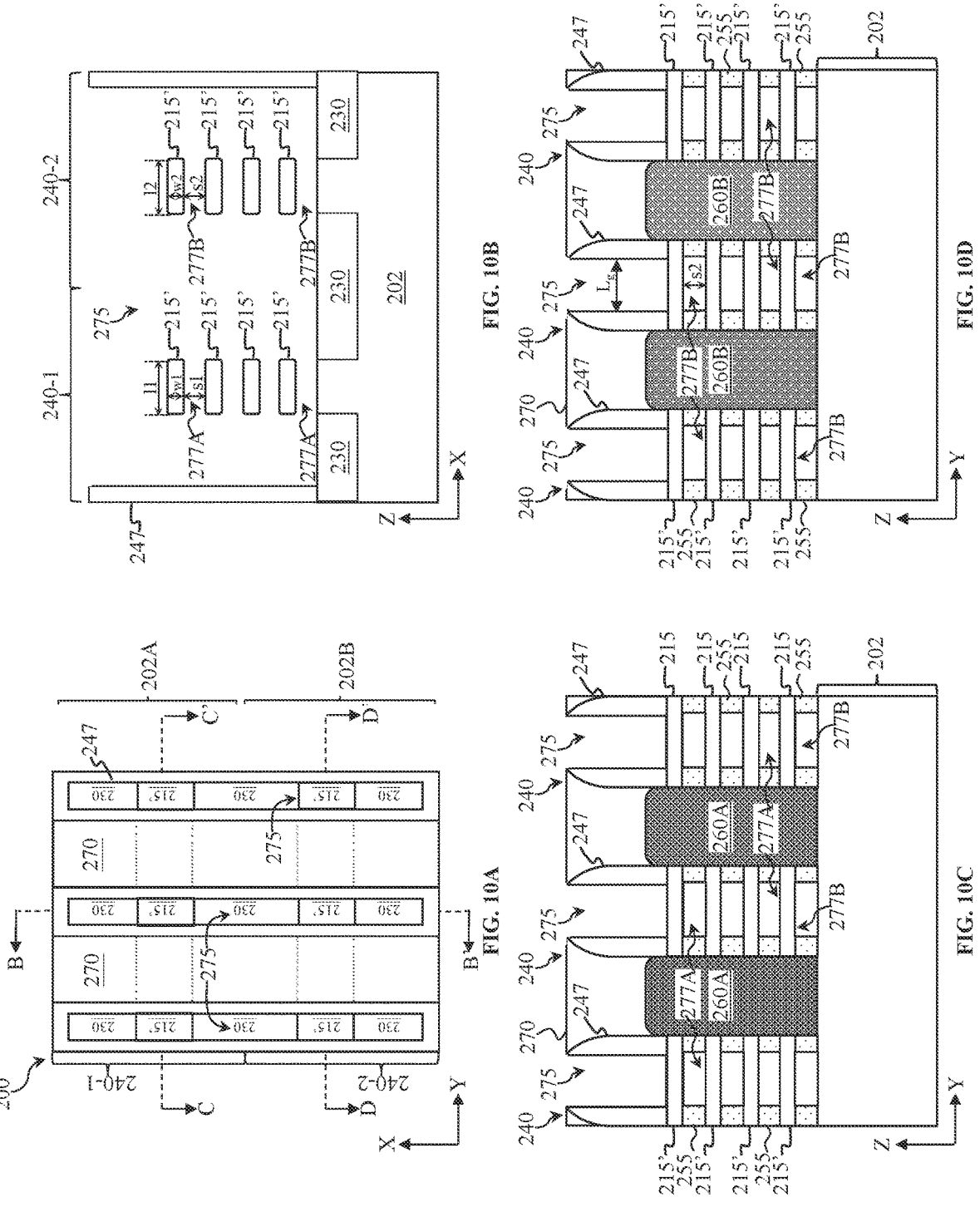
Figures 11A, 11B, 11C, 11D:
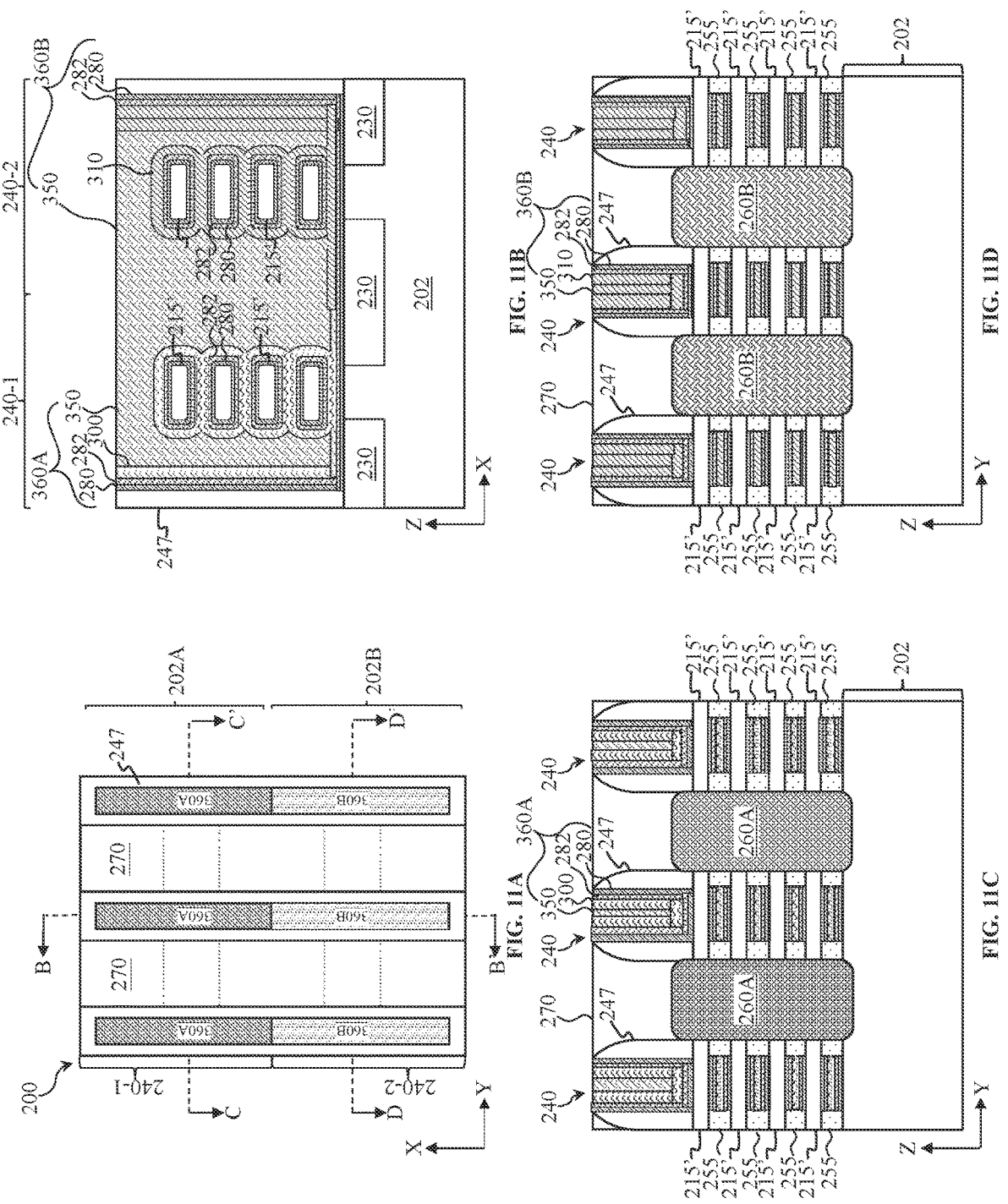
Figures 12A, 12B, 12C, 12D:
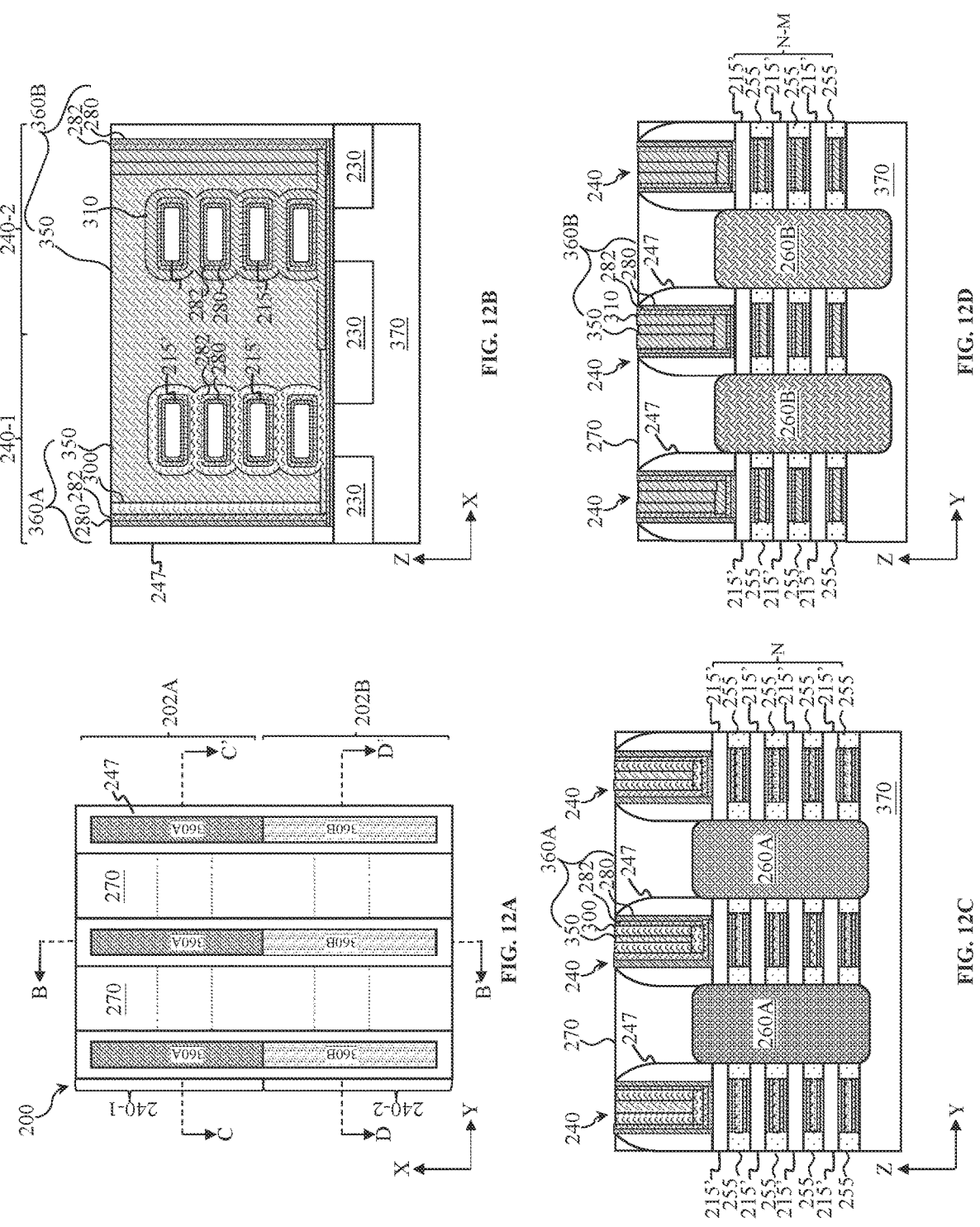
Figures 14A, 14B, 14C, 14D:
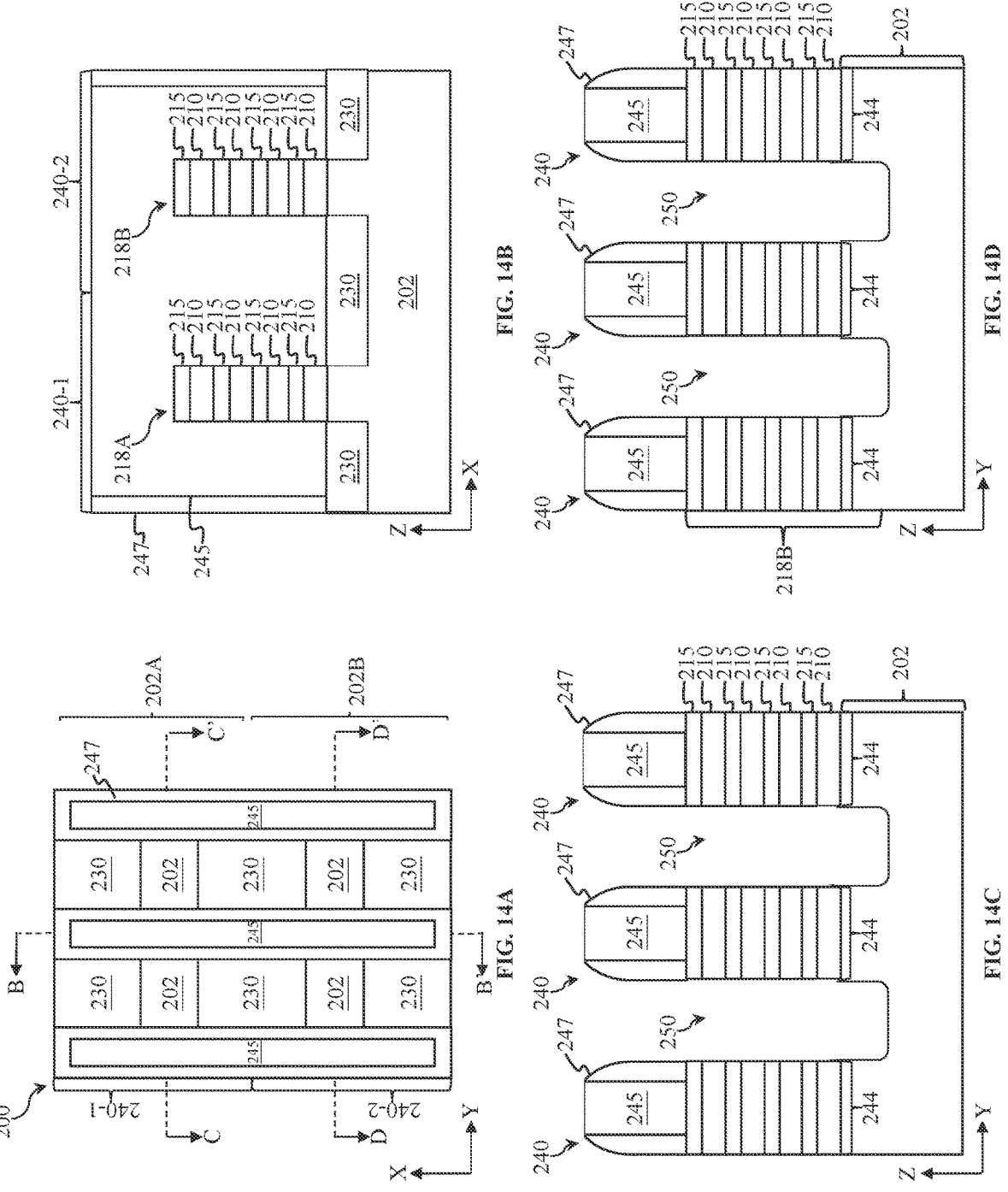
Figures 15A, 15B, 15C, 15D:
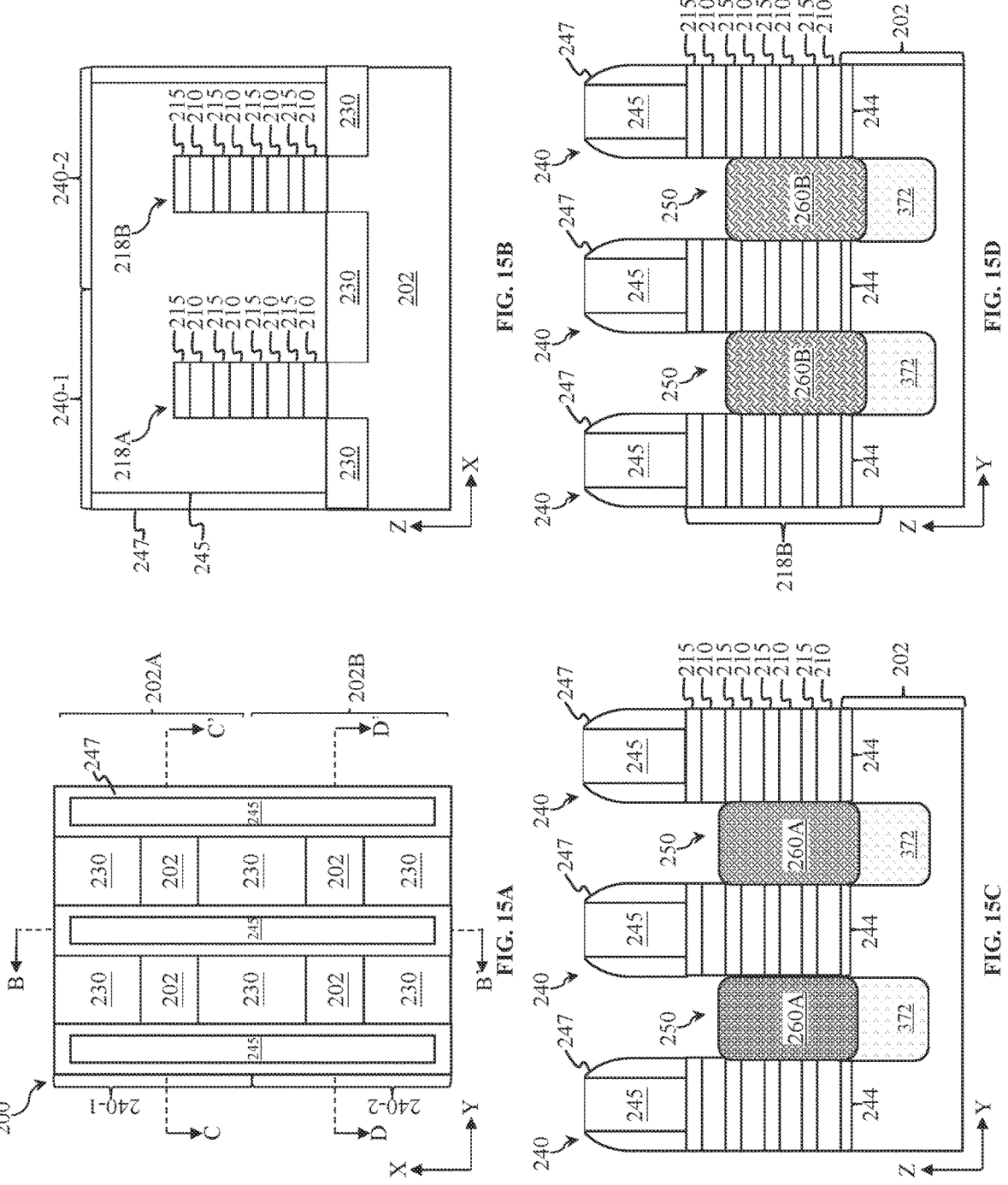
Figures 16A, 16B, 16C, 16D:
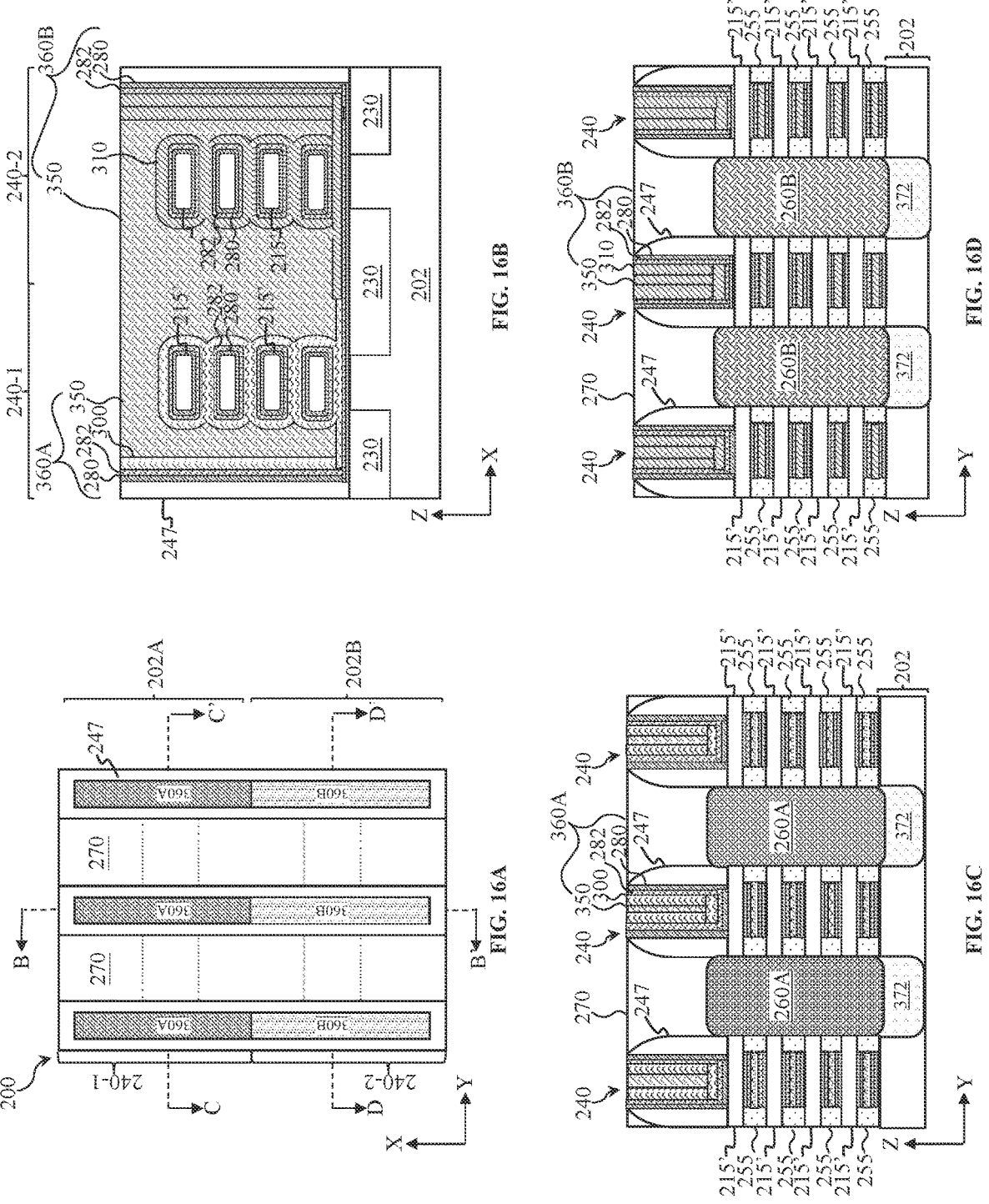
Figures 17A, 17B, 17C, 17D:
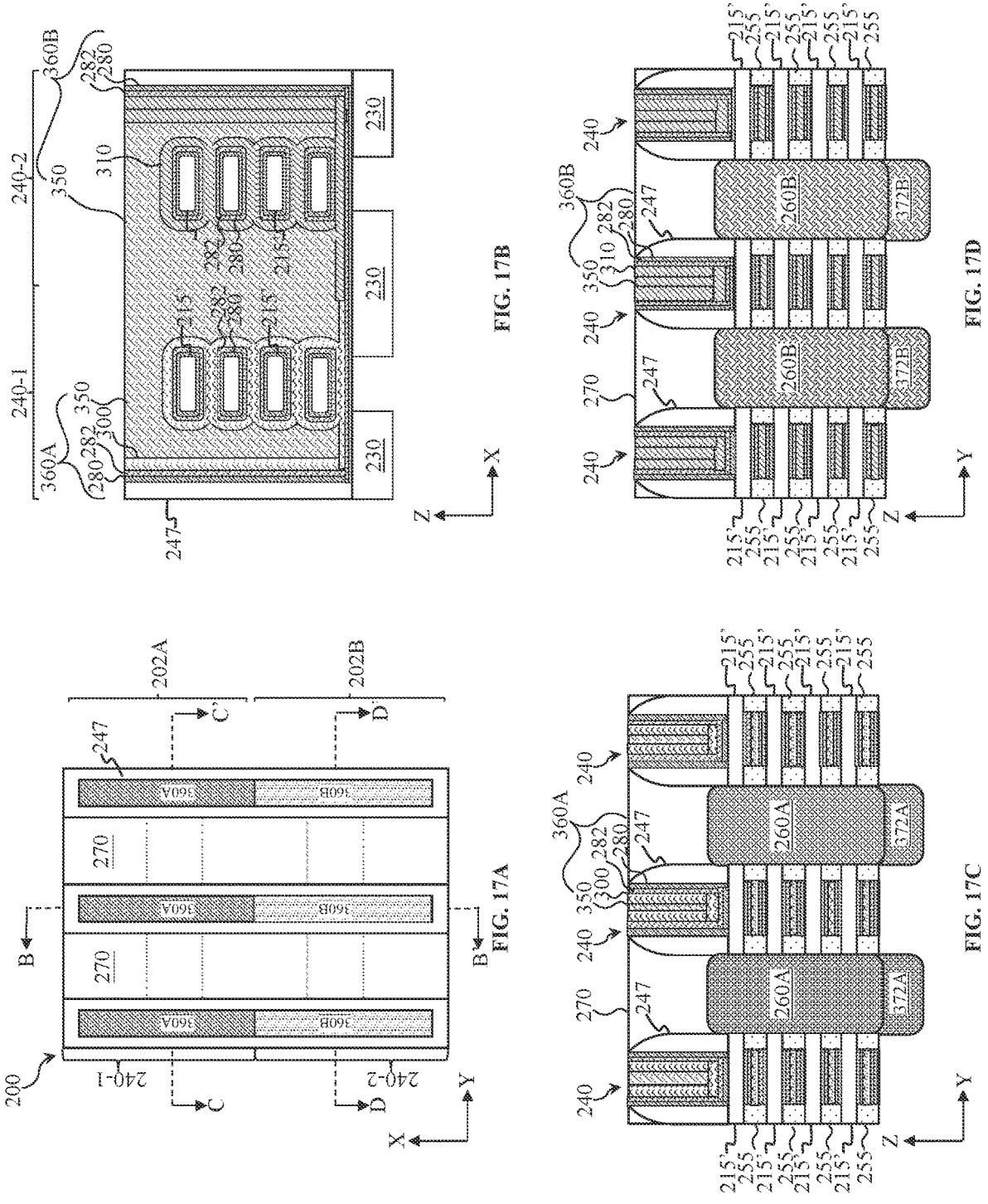
Figures 18A, 18B, 18C, 18D:
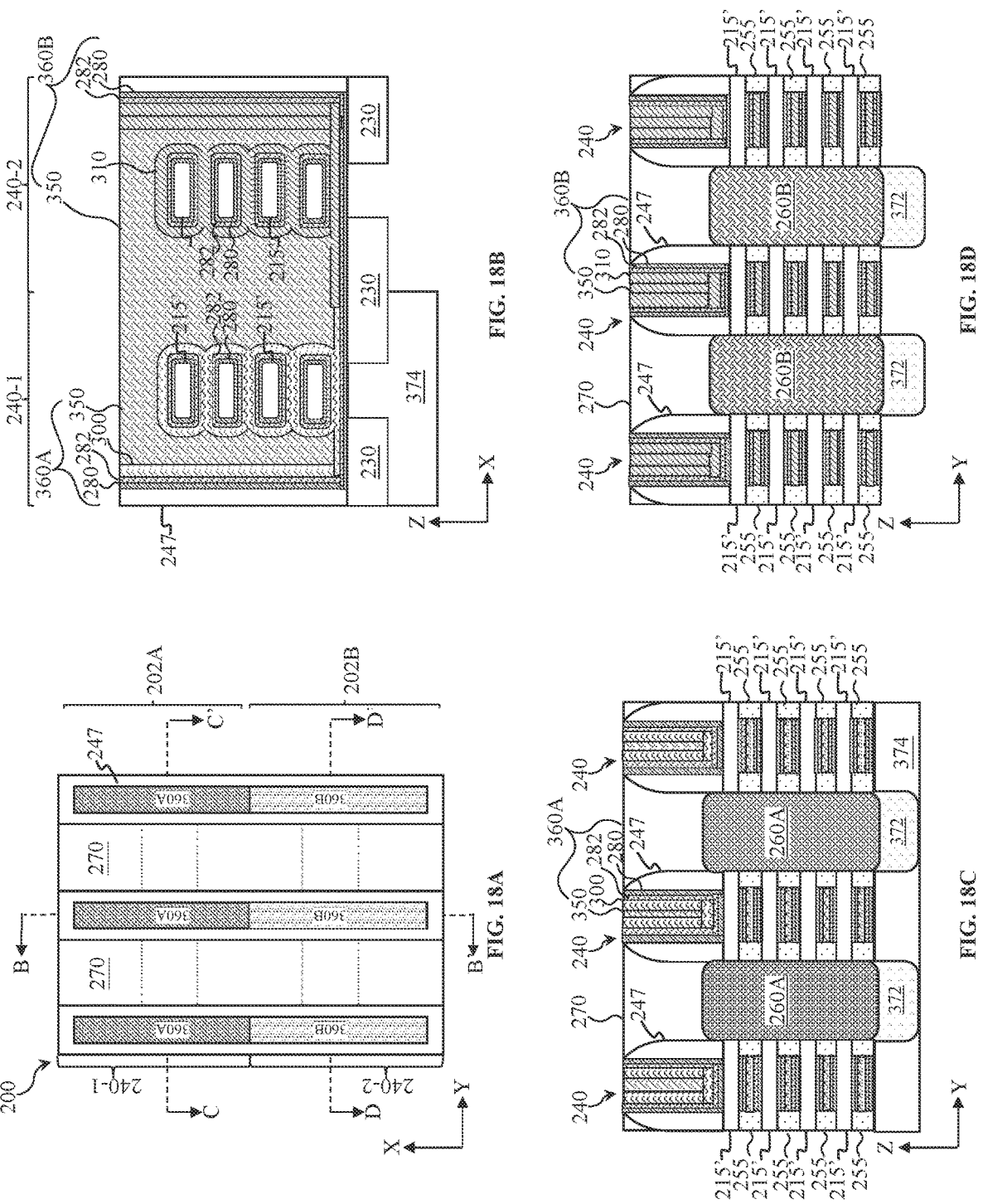
Figures 19A, 19B, 19C, 19D:
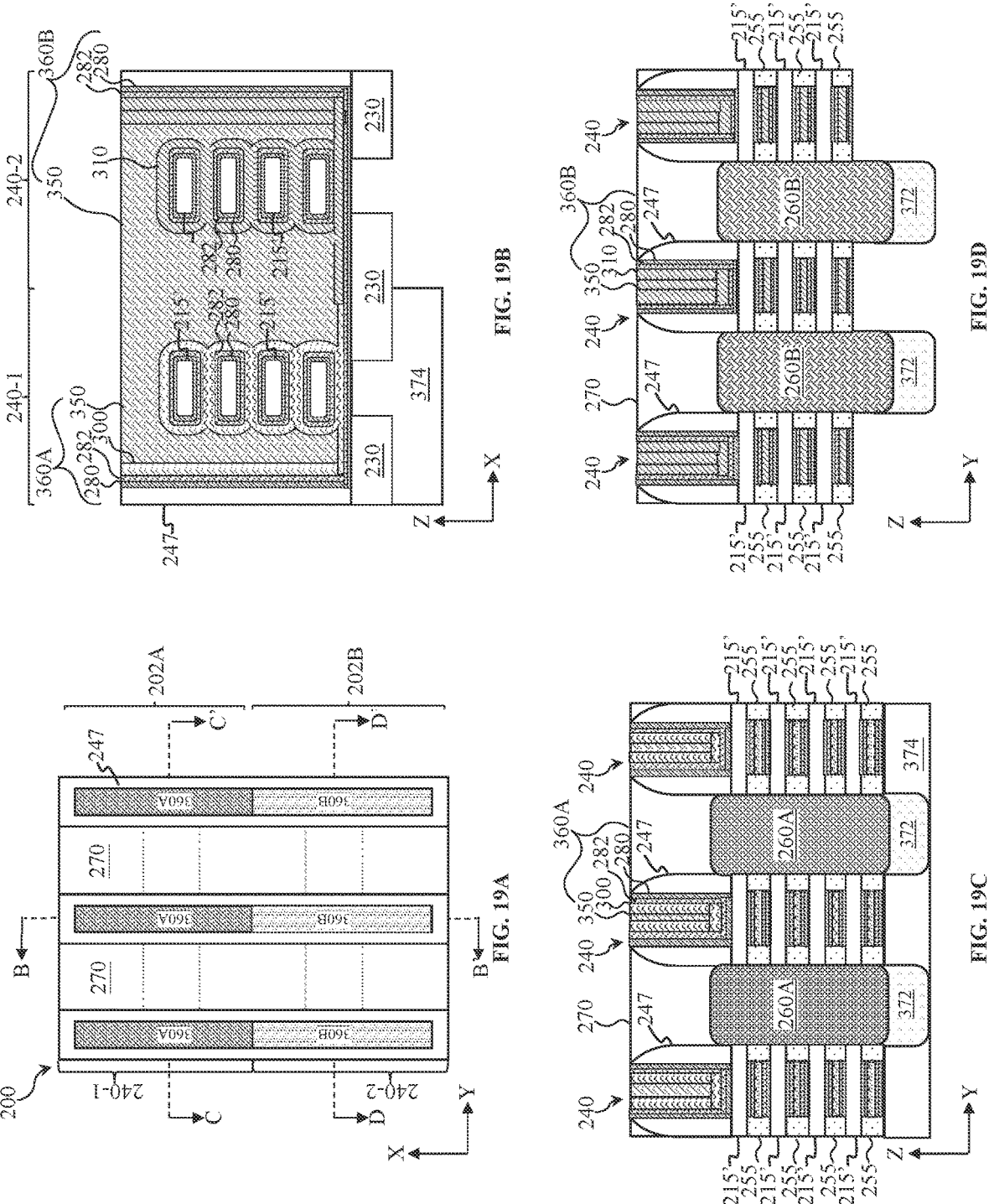
Figures 20A, 20B, 20C, 20D:
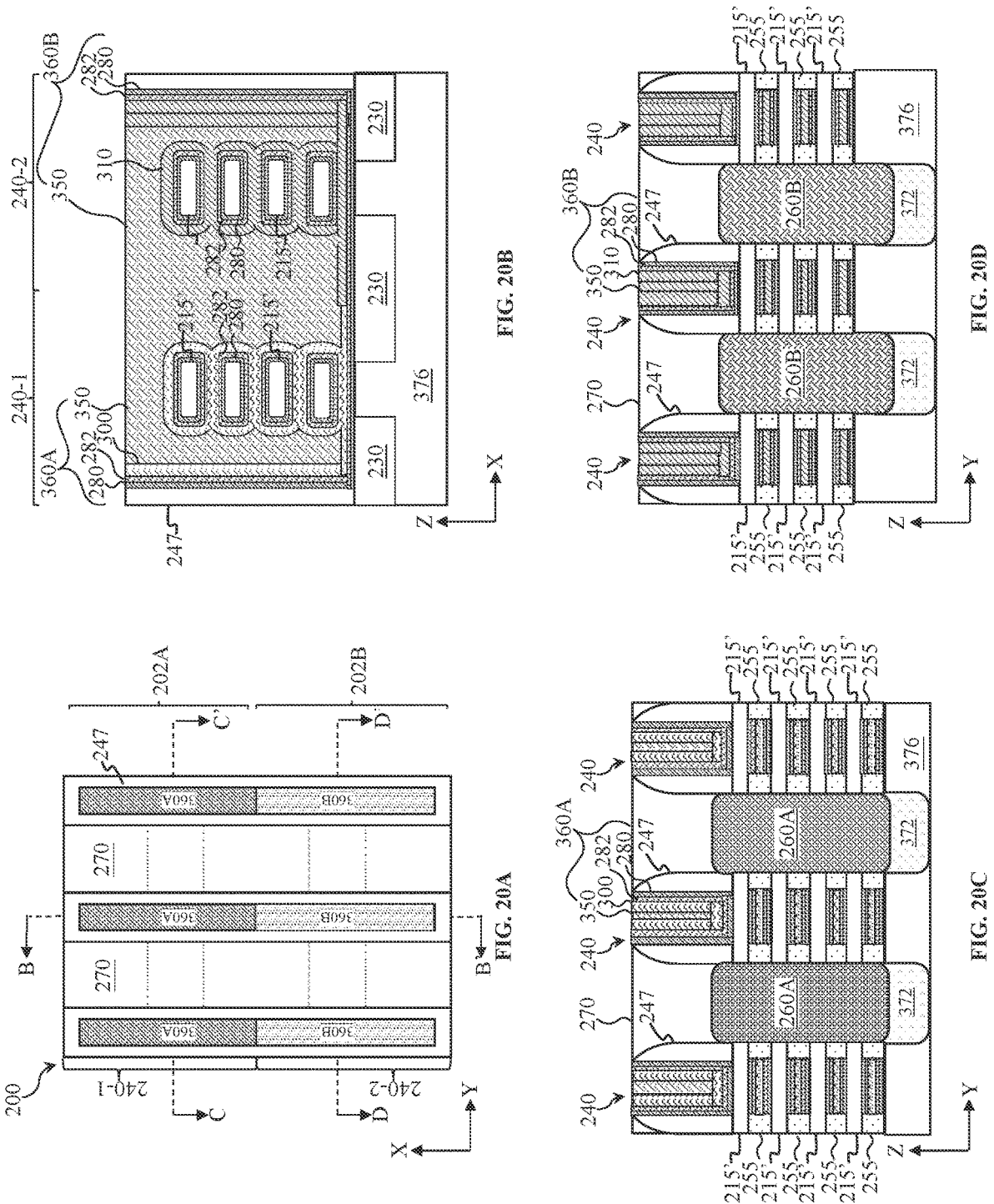
Figures 21A, 21B, 21C, 21D:
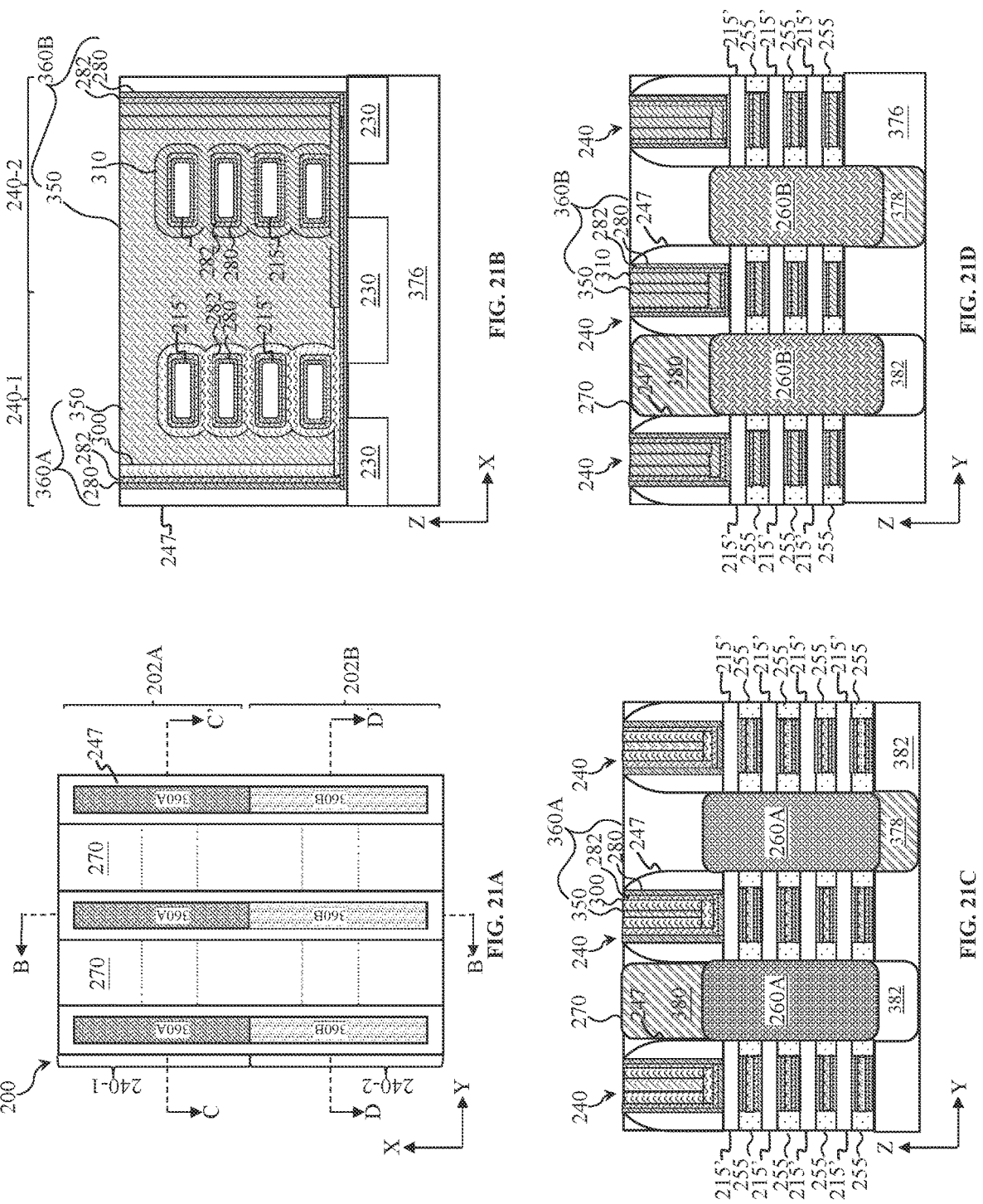

The present disclosure relates generally to integrated circuit devices, and more particularly, to multigate devices, such as gate-all-around (GAA) devices.

The following disclosure provides many different embodiments, or examples, for implementing different features. Reference numerals and/or letters may be repeated in the various examples described herein. This repetition is for the purpose of simplicity and clarity and does not in itself dictate a relationship between the various disclosed embodiments and/or configurations. Further, specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Moreover, the formation of a feature on, connected to, and/or coupled to another feature in the present disclosure may include embodiments in which the features are formed in direct contact, and may also include embodiments in which additional features may be formed interposing the features, such that the features may not be in direct contact.

Further, spatially relative terms, for example, "lower," "upper," "horizontal," "vertical," "above." "over." "below." "beneath," "up." "down," "top," "bottom," etc. as well as derivatives thereof (e.g., "horizontally," "downwardly," "upwardly." etc.) are used herein for case of description to describe one element or feature's relationship to another element(s) or feature(s). The spatially relative terms are intended to encompass different orientations than as depicted of a device (or system or apparatus) including the element(s) or feature(s), including orientations associated with the device's use or operation. The apparatus may be otherwise oriented (rotated 90 degrees or at other orientations) and the spatially relative descriptors used herein may likewise be interpreted accordingly.

FIG. 1 is a flow chart of a method 100 for fabricating a multigate device according to various aspects of the present disclosure. In some embodiments, method 100 fabricates a multi-gate device that includes p-type GAA transistors and n-type GAA transistors. In some embodiments, method 100 fabricates a multi-gate device that includes first GAA transistors and second GAA transistors with different characteristics, such as the first GAA transistors in a critical path and the second GAA transistors in a non-critical path. In the present embodiment, a path is defined as a route to distribute signal in a circuit. A critical path is the place that mainly dominates the circuit speed (or signal distribution speed) that is dependent on different circuit applications. On the other hand, if the circuit speed is varied with transistors' performance significantly, then the signal path will be referred to as critical path. In some respects, the critical path and the non-critical GAA path may have different power consumptions during field operations. In an integrated circuit, the electrical current (and also electrical power) in the circuit may be nonuniformly distributed. Average current densities in some local areas are greater than those in other local areas. Those areas with greater average current densities are referred to as critical paths, which leads to various concerns, such as reducing power efficiency, degrading circuit performance, decreasing circuit speed, increasing battery size, and causing reliability issues. In the existing method, device dimensions, such as channel widths of the transistors in the critical paths are increased to adjust or reduce the corresponding average current density. However, the existing method will increase other issues. For example, the circuit areas are increased, and the packing density is reduced. In other examples, adjustment to the dimensions of the devices in the critical paths introduces jog in an active region that further increase circuit layout complexity and challenges circuit design due to the smaller circuit cell height and gate pitch in advanced technology nodes.

The disclosed multigate device and the method making the same addresses those concerns. Particularly, for performance boosting, the present disclosure chooses high driving devices (or d greater sheet number devices) at critical path; and low power devices (or less sheet number devices) at non-critical path.

At block 102, a first semiconductor layer stack and a second semiconductor layer stack are formed over a substrate. The first semiconductor layer stack and the second semiconductor layer stack include first semiconductor layers and second semiconductor layers stacked vertically in an alternating configuration. At block 104, a gate structure is formed over a first region of the first semiconductor layer stack and a first region of the second semiconductor layer stack. The gate structure includes a dummy gate stack and gate spacers. At block 106, portions of the first semiconductor layer stack in second regions and portions of the second semiconductor layer stack in second regions are removed to form source/drain recesses. At block 108, inner spacers are formed along sidewalls of the first semiconductor layers in the first semiconductor layer stack and the second semiconductor layer stack. At block 110, epitaxial source/drain features are formed in the source/drain recesses. At block 112, an interlayer dielectric (ILD) layer is formed over the epitaxial source/drain features. At block 114, the dummy gate stack is removed, thereby forming a gate trench that exposes the first semiconductor layer stack in a first gate region and the second semiconductor layer stack in a second gate region. At block 116, the first semiconductor layers are removed from the first semiconductor layer stack and the second semiconductor layer stack exposed by the gate trench, thereby forming gaps between the second semiconductor layers. At block 118, gate stacks are formed in the gate trench around the second semiconductor layers in the first gate region and the second gate region. At block 120, other fabrication processes, including forming an interconnect structure, are performed from the frontside of the workpiece. At block 122, the workpiece is thinned down from the backside. At block 124, the channel layers and the gate stack in the second region are reduced while the channel layers and the gate stack in the first region remain unchanged. Additional processing is contemplated by the present disclosure. Additional steps can be provided before, during, and after method 100, and some of the steps described can be moved, replaced, or eliminated for additional embodiments of method 100. The discussion that follows illustrates various embodiments of nanowire-based integrated circuit devices that can be fabricated according to method 100.

FIGS. 2A-12A, FIGS. 2B-12B, FIGS. 2C-12C, and FIGS. 2D-12D are fragmentary diagrammatic views of a multigate device 200, in portion or entirety, at various fabrication stages (such as those associated with method 100 in FIG. 1) according to various aspects of the present disclosure. In particular, FIGS. 2A-12A are top views of multigate device 200 in an X-Y plane;

FIGS. 2B-12B are diagrammatic cross-sectional views of multigate device 200 in an X-Z plane along lines B-B' respectively of FIGS. 2A-12A, FIGS. 2C-12C are diagrammatic cross-sectional views of multigate device 200 in a Y-Z plane along lines C-C' respectively of FIGS. 2A-12A; and FIGS. 2D-12D are diagrammatic cross-sectional views of multigate device 200 in the Y-Z plane along lines D-D' respectively of FIGS. 2A-12A. Multigate device 200 may be included in a microprocessor, a memory, and/or other IC device. In some embodiments, multigate device 200 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. In some embodiments, multigate device 200 is included in a non-volatile memory, such as a non-volatile random-access memory (NVRAM), a flash memory, an electrically erasable programmable read only memory (EEPROM), an electrically programmable read-only memory (EPROM), other suitable memory type, or combinations thereof. FIGS. 2A-12A, FIGS. 2B-12B, FIGS. 2C-12C, and FIGS. 2D-12D have been simplified for the sake of clarity to better understand the inventive concepts of the present disclosure. Additional features can be added in multigate device 200, and some of the features described below can be replaced, modified, or eliminated in other embodiments of multigate device 200.

Turning to FIGS. 2A-2D, multigate device 200 includes a substrate (wafer) 202. In the depicted embodiment, substrate 202 includes silicon. Alternatively, or additionally, substrate 202 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 202 can include various doped regions depending on design requirements of multigate device 200. In the depicted embodiment, the substrate 202 includes a first region 202A for first GAA transistors and a second region 202B for second GAA transistors. The first GAA transistors and the second GAA transistors are different in device characteristics and/or circuit performance. For examples, the first GAA transistors in the first region 202A are in a critical path while the second GAA transistors in the second region 202B are in a non-critical path. In the depicted embodiment, the first region 202A and the second region 202B are adjacent. Alternatively, the first region 202A and the second region 202B may be distanced from each other. In yet other embodiments, the substrate 202 includes a first region, a second region, and a third region for respective GAA transistors with different characteristics, such as different power densities. The workpiece 200, or the substrate 202, includes a frontside 202FS and a backside 202BS.

The substrate 202 also includes a p-type doped region (referred to hereinafter as a p-well), which can be configured for n-type GAA transistors, and an n-type doped region (referred to hereinafter as an n-well), which can be configured for p-type GAA transistors. N-type doped regions are doped with n-type dopants, such as phosphorus, arsenic, other n-type dopant, or combinations thereof. P-type doped regions are doped with p-type dopants, such as boron, indium, other p-type dopant, or combinations thereof. The various doped regions can be formed directly on and/or in substrate 202, for example, providing a p-well structure, an n-well structure, a dual-well structure, a raised structure, or combinations thereof. An ion implantation process, a diffusion process, and/or other suitable doping process can be performed to form the various doped regions.

A semiconductor layer stack 205 is formed over substrate 202, where semiconductor layer stack 205 includes semiconductor layers 210 and semiconductor layers 215 stacked vertically (e.g., along the z-direction) in an interleaving or alternating configuration from a surface of substrate 202. In some embodiments, semiconductor layers 210 and semiconductor layers 215 are epitaxially grown in the depicted interleaving and alternating configuration. For example, a first one of semiconductor layers 210 is epitaxially grown on substrate, a first one of semiconductor layers 215 is epitaxially grown on the first one of semiconductor layers 210, a second one of semiconductor layers 210 is epitaxially grown on the first one of semiconductor layers 215, and so on until semiconductor layers stack 205 has a desired number of semiconductor layers 210 and semiconductor layers 215. In such embodiments, semiconductor layers 210 and semiconductor layers 215 can be referred to as epitaxial layers. In some embodiments, epitaxial growth of semiconductor layers 210 and semiconductor layers 215 is achieved by a molecular beam epitaxy (MBE) process, a chemical vapor deposition (CVD) process, a metalorganic chemical vapor deposition (MOCVD) process, other suitable epitaxial growth process, or combinations thereof.

A composition of semiconductor layers 210 is different than a composition of semiconductor layers 215 to achieve etching selectivity and/or different oxidation rates during subsequent processing. In some embodiments, semiconductor layers 210 have a first etch rate to an etchant and semiconductor layers 215 have a second etch rate to the etchant, where the second etch rate is less than the first etch rate. In some embodiments, semiconductor layers 210 have a first oxidation rate and semiconductor layers 215 have a second oxidation rate, where the second oxidation rate is less than the first oxidation rate. In the depicted embodiment, semiconductor layers 210 and semiconductor layers 215 include different materials, constituent atomic percentages, constituent weight percentages, thicknesses, and/or characteristics to achieve desired etching selectivity during an etching process, such as an etching process implemented to form suspended channel layers in channel regions of multigate device 200. For example, where semiconductor layers 210 include silicon germanium and semiconductor layers 215 include silicon, a silicon etch rate of semiconductor layers 215 is less than a silicon germanium etch rate of semiconductor layers 210. In some embodiments, semiconductor layers 210 and semiconductor layers 215 can include the same material but with different constituent atomic percentages to achieve the etching selectivity and/or different oxidation rates. For example, semiconductor layers 210 and semiconductor layers 215 can include silicon germanium, where semiconductor layers 210 have a first silicon atomic percent and/or a first germanium atomic percent and semiconductor layers 215 have a second, different silicon atomic percent and/or a second, different germanium atomic percent. The present disclosure contemplates that semiconductor layers 210 and semiconductor layers 215 include any combination of semiconductor materials that can provide desired etching selectivity, desired oxidation rate differences, and/or desired performance characteristics (e.g., materials that maximize current flow), including any of the semiconductor materials disclosed herein.

As described further below, semiconductor layers 215 or portions thereof form channel regions of multigate device 200. In the depicted embodiment, semiconductor layer stack 205 includes four semiconductor layers 210 and four semiconductor layers 215 configured to form four semiconductor layer pairs disposed over substrate 202, each semiconductor layer pair having a respective first semiconductor layer 210 and a respective second semiconductor layer 215. After undergoing subsequent processing, such configuration will result in multigate device 200 having four or less than four channels in different regions. However, the present disclosure contemplates embodiments where semiconductor layer stack 205 includes more or less semiconductor layers, for example, depending on a number of channels desired for multigate device 200 (e.g., a GAA transistor) and/or design requirements of multigate device 200. For example, semiconductor layer stack 205 can include two to ten semiconductor layers 210 and two to ten semiconductor layers 215. In furtherance of the depicted embodiment, semiconductor layers 210 have a thickness t1 and semiconductor layers 215 have a thickness t2, where thickness t1 and thickness t2 are chosen based on fabrication and/or device performance considerations for multigate device 200. For example, thickness t1 can be configured to define a desired distance (or gap) between adjacent channels of multigate device 200 (e.g., between semiconductor layers 215), thickness t2 can be configured to achieve desired thickness of channels of multigate device 200, and both thickness t1 and thickness t2 can be configured to achieve desired performance of multigate device 200. In some embodiments, thickness t1 and thickness t2 are about 1 nm to about 10 nm.

Turning to FIGS. 3A-3D, semiconductor layer stack 205 is patterned to form a fin (also referred to as fin structures, fin elements, etc.) 218A in the first region 202A and a fin 218B in the second region 202B. Fins 218A, 218B include a substrate portion (i.e., a portion of substrate 202) and a semiconductor layer stack portion (i.e., a remaining portion of semiconductor layer stack 205 including semiconductor layers 210 and semiconductor layers 215). Fins 218A, 218B extend substantially parallel to one another along a y-direction, having a length defined in the y-direction, a width defined in an x-direction, and a height defined in a z-direction. In some implementations, a lithography and/or etching process is performed to pattern semiconductor layer stack 205 to form fins 218A, 218B. The lithography process can include forming a resist layer over semiconductor layer stack 205 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The etching process removes portions of semiconductor layer stack 205 using the patterned resist layer as an etch mask. In some embodiments, the patterned resist layer is formed over a hard mask layer disposed over semiconductor layer stack 205, a first etching process removes portions of the hard mask layer to form a patterned hard mask layer, and a second etching process removes portions of semiconductor layer stack 205 using the patterned hard mask layer as an etch mask. The etching process can include a dry etching process, a wet etching process, other suitable etching process, or combinations thereof. In some embodiments, the etching process is a reactive ion etching (RIE) process. After the etching process, the patterned resist layer (and, in some embodiments, a hard mask layer) is removed, for example, by a resist stripping process or other suitable process. Alternatively, fins 218A, 218B are formed by a multiple patterning process, such as a double patterning lithography (DPL) process (for example, a lithography-etch-lithography-etch (LELE) process, a self-aligned double patterning (SADP) process, a spacer-is-dielectric (SID) SADP process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof. In some embodiments, directed self-assembly (DSA) techniques are implemented while patterning semiconductor layer stack 205. Further, in some embodiments, the exposure process can implement mask-less lithography, electron-beam (e-beam) writing, and/or ion-beam writing for patterning the resist layer.

An isolation feature(s) 230 is formed over and/or in substrate 202 to isolate various regions, such as various device regions, of multigate device 200. For example, isolation features 230 surround a bottom portion of fins 218A, 218B, such that isolation features 230 separate and isolate fins 218A, 218B from each other. In the depicted embodiment, isolation features 230 surround the substrate portion of fins 218A. 218B (e.g., doped regions 204A, 204B of substrate 202) and partially surround the semiconductor layer stack portion of fins 218A, 218B (e.g., a portion of bottommost semiconductor layer 210). However, the present disclosure contemplates different configurations of isolation features 230 relative to fins 218A, 218B. Isolation features 230 include silicon oxide, silicon nitride, silicon oxynitride, other suitable isolation material (for example, including silicon, oxygen, nitrogen, carbon, or other suitable isolation constituent), or combinations thereof. Isolation features 230 can include different structures, such as shallow trench isolation (STI) structures, deep trench isolation (DTI) structures, and/or local oxidation of silicon (LOCOS) structures. For example, isolation features 230 can include STI features that define and electrically isolate fins 218A, 218B from other active device regions (such as fins) and/or passive device regions. STI features can be formed by etching a trench in substrate 202 (for example, by using a dry etching process and/or a wet etching process) and filling the trench with insulator material (for example, by using a CVD process or a spin-on glass process). A chemical mechanical polishing (CMP) process may be performed to remove excessive insulator material and/or planarize a top surface of isolation features 230. In another example, STI features can be formed by depositing an insulator material over substrate 202 after forming fins 218A, 218B (in some implementations, such that the insulator material layer fills gaps (trenches) between fins 218A, 218B) and etching back the insulator material layer to form isolation features 230. In some embodiments, STI features include a multi-layer structure that fills the trenches, such as a silicon nitride comprising layer disposed over a thermal oxide comprising liner layer. In another example, STI features include a dielectric layer disposed over a doped liner layer (including, for example, boron-silicate glass (BSG) or phospho-silicate glass (PSG)). In yet another example, STI features include a bulk dielectric layer disposed over a liner dielectric layer, where the bulk dielectric layer and the liner dielectric layer include materials depending on design requirements. In some embodiments, a cladding layer 220 is formed on the sidewalls of the fins 218A, 218B by a suitable method, such as selective epitaxial growth. The cladding layer 220 may include a semiconductor material similar to that of the first semiconductor layers 210 in composition. In the depicted embodiment, the cladding layer 220 includes silicon germanium. The cladding layer 220 provides paths to remove the first semiconductor layers 210 and is removed with the first semiconductor layers 210 during a channel-release process at later stage (to be described below). The cladding layer 220 is not shown in the following figures but it may present before it is removed in accordance with some embodiments.

Turning to FIGS. 4A-4D, gate structures 240 are formed over portions of fins 218A, 218B and over isolation features

230. Gate structures 240 extend lengthwise in a direction that is different than (e.g., orthogonal to) the lengthwise direction of fins 218A, 218B. For example, gate structures 240 extend substantially parallel to one another along the x-direction, having a length defined in the y-direction, a width defined in the x-direction, and a height defined in the z-direction. Gate structures 240 are disposed on portions of fins 218A, 218B and define source/drain regions 242 and channel regions 244 of fins 218A, 218B. In the X-Z plane, gate structures 240 wrap top surfaces and sidewall surfaces of fins 218A, 218B. In the Y-Z plane, gate structures 240 are disposed over top surfaces of respective channel regions 244 of fins 218A, 218B, such that gate structures 240 interpose respective source/drain regions 242. The gate structure 240 may include a gate region 240-1 that corresponds with a portion of the respective gate structure 240 that will be configured for a first GAA transistor in the first region 202A (and thus corresponds to a critical path) and a gate region 240-2 that corresponds with a portion of the respective gate structure 240 that will be configured for a second GAA transistor in the second region 202B (and thus corresponds to a non-critical path). Gate structures 240 may be configured differently in gate region 240-1 and gate region 240-2, depending on the transistors to be formed on these regions, such as p-type transistors or n-type transistors.

In FIGS. 4A-4D, each gate structure 240 includes a dummy gate stack 245. In the depicted embodiment, a width of dummy gate stacks 245 defines a gate length (Lg) of gate structures 240 (here, in the y-direction), where the gate length defines a distance (or length) that current (e.g., carriers, such as electrons or holes) travels between source/drain regions 242 when the corresponding transistors are switched (turned) on. In some embodiments, the gate length is about 5 nm to about 250 nm. Gate length can be tuned to achieve desired operation speeds of the GAA transistors and/or desired packing density of the GAA transistors. For example, when a GAA transistor is switched on, current flows between source/drain regions of the GAA transistor. Increasing the gate length increases a distance required for current to travel between the source/drain regions, increasing a time it takes for the GAA transistor to switch fully on. Conversely, decreasing the gate length decreases the distance required for current to travel between the source/drain regions, decreasing a time it takes for the GAA transistor to switch fully on. Smaller gate lengths provide GAA transistors that switch on/off more quickly, facilitating faster, high speed operations. Smaller gate lengths also facilitate tighter packing density (i.e., more GAA transistors can be fabricated in a given area of an IC chip), increasing a number of functions and applications that can be fabricated on the IC chip. In the depicted embodiment, the gate length of one or more of gate structures 240 is configured to have the gate length ranging between about 5 nm and about 20 nm. In some embodiments, multigate device 200 can include GAA transistors having different gate lengths. For example, a gate length of one or more of gate structures 240 can be configured to provide GAA transistors having mid-length or long-length channels (M/LC). In some embodiments, the gate length of M/LC GAA transistors is about 20 nm to about 250 nm.

Dummy gate stacks 245 include a dummy gate electrode, and in some embodiments, a dummy gate dielectric. The dummy gate electrode includes a suitable dummy gate material, such as polysilicon layer. In embodiments where dummy gate stacks 245 include a dummy gate dielectric disposed between the dummy gate electrode and fins 218A, 218B, the dummy gate dielectric includes a dielectric material, such as silicon oxide, a high-k dielectric material, other suitable dielectric material, or combinations thereof. Examples of high-k dielectric material include $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, or combinations thereof. In some embodiments, the dummy gate dielectric includes an interfacial layer (including, for example, silicon oxide) disposed over fins 218A, 218B and a high-k dielectric layer disposed over the interfacial layer. Dummy gate stacks 245 can include numerous other layers, for example, capping layers, interface layers, diffusion layers, barrier layers, hard mask layers, or combinations thereof. For example, dummy gate stacks 245 can further include a hard mask layer disposed over the dummy gate electrode.

Dummy gate stacks 245 are formed by deposition processes, lithography processes, etching processes, other suitable processes, or combinations thereof. For example, a deposition process is performed to form a dummy gate electrode layer over fins 218A, 218B and isolation features 230. In some embodiments, a deposition process is performed to form a dummy gate dielectric layer over fins 218A, 218B and isolation features 230 before forming the dummy gate electrode layer. In such embodiments, the dummy gate electrode layer is deposited over the dummy gate dielectric layer. In some embodiment, a hard mask layer is deposited over the dummy gate electrode layer. The deposition process includes CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. A lithography patterning and etching process is then performed to pattern the dummy gate electrode layer (and, in some embodiments, the dummy gate dielectric layer and the hard mask layer) to form dummy gate stacks 245, such that dummy gate stacks 245 (including the dummy gate electrode layer, the dummy gate dielectric layer, the hard mask layer, and/or other suitable layers) is configured as depicted in FIGS. 4A-4D. The lithography patterning processes include resist coating (for example, spin-on coating), soft baking, mask aligning, exposure, post-exposure baking, developing the resist, rinsing, drying (for example, hard baking), other suitable lithography processes, or combinations thereof. The etching processes include dry etching processes, wet etching processes, other etching methods, or combinations thereof.

Each gate structure 240 further includes gate spacers 247 disposed adjacent to (i.e., along sidewalls of) respective dummy gate stacks 245. Gate spacers 247 are formed by any suitable process (i.e., deposition and anisotropic etch, such as plasma etch) and include a dielectric material. The dielectric material can include silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)). For example, a dielectric layer including silicon and nitrogen, such as a silicon nitride layer, can be deposited over dummy gate stacks 245 and subsequently etched (e.g., anisotropically etched) to form gate spacers 247. In some embodiments, gate spacers 247 include a multi-layer structure, such as a first dielectric layer that includes silicon nitride and a second dielectric layer that includes silicon oxide. In some embodiments, more than one set of spacers, such as seal spacers, offset spacers, sacrificial spacers, dummy spacers, and/or main spacers, are formed adjacent to dummy gate stacks 245. In such implementations, the various sets of spacers can include materials having different etch rates. For example, a first dielectric layer including silicon and oxygen (e.g., silicon oxide) can be deposited and etched to form a first spacer set adjacent to dummy gate stacks 245, and a second dielectric layer including silicon and nitrogen (e.g., silicon nitride) can be deposited and etched to form a second spacer set adjacent to the first spacer set.

Turning to FIGS. 5A-5D, exposed portions of fins 218A, 218B (i.e., source/drain regions 242 of fins 218A, 218B that are not covered by gate structures 240) are at least partially removed to form source/drain trenches (recesses) 250. In the depicted embodiment, an etching process completely removes semiconductor layer stack 205 in source/drain regions 242 of fins 218A, 218B, thereby exposing the substrate portion of fins 218A, 218B in source/drain regions 242. Source/drain trenches 250 thus have sidewalls defined by remaining portions of semiconductor layer stack 205, which are disposed in channel regions 244 under gate structures 240, and bottoms defined by substrate 202, such as top surfaces of substrate 202 in source/drain regions 242. In some embodiments, the etching process removes some, but not all, of semiconductor layer stack 205, such that source/drain trenches 250 have bottoms defined by semiconductor layer 210 or semiconductor layer 215 in source/drain regions 242. In some embodiments, the etching process further removes some, but not all, of the substrate portion of fins 218A, 218B, such that source/drain recesses 250 extend below a topmost surface of substrate 202. The etching process can include a dry etching process, a wet etching process, other suitable etching process, or combinations thereof. In some embodiments, the etching process is a multi-step etch process. For example, the etching process may alternate etchants to separately and alternately remove semiconductor layers 210 and semiconductor layers 215. In some embodiments, parameters of the etching process are configured to selectively etch semiconductor layer stack with minimal (to no) etching of gate structures 240 (i.e., dummy gate stacks 245 and gate spacers 247) and/or isolation features 230. In some embodiments, a lithography process, such as those described herein, is performed to form a patterned mask layer that covers gate structures 240 and/or isolation features 230, and the etching process uses the patterned mask layer as an etch mask.

In some embodiments related to the GAA device structure where channel layers are reduced, and the backside power rails are formed (such as further described in FIGS. 7A-7D and FIGS. 14A-19D), the source/drain trenches 250 are formed deeper so that a sacrificial semiconductor layer with composition different from that of the substrate 202 is deposited in before the source/drain features are deposited therein.

Turning to FIGS. 6A-6D, inner spacers 255 are formed in channel regions 244 along sidewalls of semiconductor layers 210 by any suitable process. For example, a first etching process is performed that selectively etches semiconductor layers 210 exposed by source/drain trenches 250 with minimal (to no) etching of semiconductor layers 215, such that gaps are formed between semiconductor layers 215 and between semiconductor layers 215 and substrate 202 under gate spacers 247. Portions (edges) of semiconductor layers 215 are thus suspended in the channel regions 244 under gate spacers 247. In some embodiments, the gaps extend partially under dummy gate stacks 245. The first etching process is configured to laterally etch (e.g., along the y-direction) semiconductor layers 210, thereby reducing a length of semiconductor layers 210 along the y-direction. The first etching process is a dry etching process, a wet etching process, other suitable etching process, or combinations thereof. A deposition process then forms a spacer layer over gate structures 240 and over features defining source/drain trenches 250 (e.g., semiconductor layers 215, semiconductor layers 210, and substrate 202), such as by CVD, PVD, ALD, HDPCVD, MOCVD, RPCVD, PECVD, LPCVD, ALCVD, APCVD, other suitable methods, or combinations thereof. The spacer layer partially (and, in some embodiments, completely) fills the source/drain trenches 250. The deposition process is configured to ensure that the spacer layer fills the gaps between semiconductor layers 215 and between semiconductor layers 215 and substrate 202 under gate spacers 247. A second etching process (i.e., an anisotropic etching process, such as plasma etch) is then performed that selectively etches the spacer layer to form inner spacers 255 as depicted in FIGS. 6A-6D with minimal (to no) etching of semiconductor layers 215, dummy gate stacks 245, and gate spacers 247. In some embodiments, the spacer layer is removed from sidewalls of gate spacers 247, sidewalls of semiconductor layers 215, dummy gate stacks 245, and substrate 202. The spacer layer (and thus inner spacers 255) includes a material that is different than a material of semiconductor layers 215 and a material of gate spacers 247 to achieve desired etching selectivity during the second etching process. In some embodiments, the spacer layer includes a dielectric material that includes silicon, oxygen, carbon, nitrogen, other suitable material, or combinations thereof (for example, silicon oxide, silicon nitride, silicon oxynitride, silicon carbide, or silicon oxycarbonitride). In some embodiments, the spacer layer includes a low-k dielectric material, such as those described herein. In some embodiments, dopants (for example, p-type dopants, n-type dopants, or combinations thereof) are introduced into the dielectric material, such that spacer layer includes a doped dielectric material. The inner spacers 255 provide separation and isolation between gate and source/drain features (to be described below).

Turning to FIGS. 7A-7D, epitaxial source/drain features are formed in source/drain recesses 250. For example, a semiconductor material is epitaxially grown from portions of substrate 202 and semiconductor layers 215 exposed by source/drain recesses 250, forming epitaxial source/drain features 260A in source/drain regions 242 that correspond with the first GAA transistors in the first region 202A and epitaxial source/drain features 260B in source/drain regions 242 that correspond with a second GAA transistors in the second region 202B. An epitaxy process can use CVD deposition techniques (for example, VPE and/or UHV-CVD), molecular beam epitaxy, other suitable epitaxial growth processes, or combinations thereof. The epitaxy process can use gaseous and/or liquid precursors, which interact with the composition of substrate 202 and/or semiconductor layer stack 205 (in particular, semiconductor layers 215). Epitaxial source/drain features 260A, 260B are doped with n-type dopants and/or p-type dopants. In some embodiments, for n-type GAA transistors, epitaxial source/drain features include silicon and are doped with carbon, phosphorous, arsenic, other n-type dopant, or combinations thereof (for example, forming Si:C epitaxial source/drain features, Si:P epitaxial source/drain features, or Si:C:P epitaxial source/drain features). In some embodiments, for p-type GAA transistors, epitaxial source/drain features include silicon germanium or germanium, and are doped with boron, other p-type dopant, or combinations thereof (for example, forming Si:Ge:B epitaxial source/drain features). In some embodiments, epitaxial source/drain features 260A and/or epitaxial source/drain features 260B include more than one epitaxial semiconductor layer, where the epitaxial semiconductor layers can include the same or different materials and/or dopant concentrations. In some embodiments, epitaxial source/drain features 260A, 260B include materials and/or dopants that achieve desired tensile stress and/or compressive stress in respective channel regions 244. In some embodiments, epitaxial source/drain features 260A, 260B are doped during deposition by adding impurities to a source material of the epitaxy process (i.e., in-situ). In some embodiments, epitaxial source/drain features 260A, 260B are doped by an ion implantation process subsequent to a deposition process. In some embodiments, annealing processes (e.g., rapid thermal annealing (RTA) and/or laser annealing) are performed to activate dopants in epitaxial source/drain features 260A, 260B and/or other source/drain regions (for example, heavily doped source/drain regions and/or lightly doped source/drain (LDD) regions). In some embodiments, epitaxial source/drain features 260A, 260B are formed in separate processing sequences that include, for example, masking the GAA transistor in the second region 202B when forming epitaxial source/drain features 260A in the first region 202A and masking the GAA transistor in the first region 202A when forming epitaxial source/drain features 260B in the second region 202B.

In some embodiments, the source/drain trenches 250 are formed deeper, as described in FIGS. 5A-5D. A sacrificial semiconductor layer is first epitaxially grown in the deeper source/drain trenches 250, then the source/drain features 260A and 260B are epitaxially grown on the sacrificial semiconductor layer. In the depicted embodiment, the substrate 202 includes silicon and the sacrificial semiconductor layer includes silicon germanium to provide etch selectivity (to be further described in FIGS. 12A-19D).

Turning to FIGS. 8A-8D, an inter-level dielectric (ILD) layer 270 is formed over isolation features 230, epitaxial source/drain features 260A, 260B, and gate spacers 247, for example, by a deposition process (such as CVD, PVD, ALD, HDPCVD, MOCVD, RPCVD, PECVD, LPCVD, ALCVD, APCVD, other suitable methods, or combinations thereof). ILD layer 270 is disposed between adjacent gate structures 240. In some embodiments, ILD layer 270 is formed by a flowable CVD (FCVD) process that includes, for example, depositing a flowable material (such as a liquid compound) over multigate device 200 and converting the flowable material to a solid material by a suitable technique, such as thermal annealing and/or ultraviolet radiation treating. ILD layer 270 includes a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, California), Xerogel, Aerogel, amorphous fluorinated carbon, Parylene, BCB, SiLK (Dow Chemical, Midland, Michigan), polyimide, other low-k dielectric material, or combinations thereof. In the depicted embodiment, ILD layer 270 is a dielectric layer that includes a low-k dielectric material (generally referred to as a low-k dielectric layer). ILD layer 270 can include a multilayer structure having multiple dielectric materials. In some embodiments, a contact etch-stop layer (CESL) is disposed between ILD layer 270 and isolation features 230, epitaxial source/drain features 260A, 260B, and gate spacers 247. The CESL includes a material different than ILD layer 270, such as a dielectric material that is different than the dielectric material of ILD layer 270. For example, where ILD layer 270 includes a low-k dielectric material, the CESL includes silicon and nitrogen, such as silicon nitride or silicon oxynitride. Subsequent to the deposition of ILD layer 270 and/or the CESL, a CMP process and/or other planarization process can be performed until reaching (exposing) a top portion (or top surface) of dummy gate stacks 245. In some embodiments, the planarization process removes hard mask layers of dummy gate stacks 245 to expose underlying dummy gate electrodes of dummy gate stacks 245, such as polysilicon gate electrode layers.

ILD layer 270 may be a portion of a multilayer interconnect (MLI) feature disposed over substrate 202. The MLI feature electrically couples various devices (for example, p-type GAA transistors and/or n-type GAA transistors of multigate device 200, transistors, resistors, capacitors, and/or inductors) and/or components (for example, gate structures and/or epitaxial source/drain features of p-type GAA transistors and/or n-type GAA transistors), such that the various devices and/or components can operate as specified by design requirements of multigate device 200. The MLI feature includes a combination of dielectric layers and electrically conductive layers (e.g., metal layers) configured to form various interconnect structures. The conductive layers are configured to form vertical interconnect features, such as device-level contacts and/or vias, and/or horizontal interconnect features, such as conductive lines. Vertical interconnect features typically connect horizontal interconnect features in different layers (or different planes) of the MLI feature. During operation, the interconnect features are configured to route signals between the devices and/or the components of multigate device 200 and/or distribute signals (for example, clock signals, voltage signals, and/or ground signals) to the devices and/or the components of multigate device 200.

Turning to FIGS. 9A-9D, dummy gate stacks 245 are removed from gate structures 240, thereby exposing semiconductor layer stacks 205 of fins 218A, 218B in the first gate region 240-1 and the second gate region 240-2. In the depicted embodiment, an etching process completely removes dummy gate stacks 245 to expose semiconductor layers 215 and semiconductor layers 210 in channel regions 244. The etching process is a dry etching process, a wet etching process, other suitable etching process, or combinations thereof. In some embodiments, the etching process is a multi-step etch process. For example, the etching process may alternate etchants to separately remove various layers of dummy gate stacks 245, such as the dummy gate electrode layers, the dummy gate dielectric layers, and/or the hard mask layers. In some embodiments, the etching process is configured to selectively etch dummy gate stacks 245 with minimal (to no) etching of other features of multigate device 200, such as ILD layer 270, gate spacers 247, isolation features 230, semiconductor layers 215, and semiconductor layers 210. In some embodiments, a lithography process, such as those described herein, is performed to form a patterned mask layer that covers ILD layer 270 and/or gate spacers 247, and the etching process uses the patterned mask layer as an etch mask.

Turning to FIGS. 10A-10D, semiconductor layers 210 of semiconductor layer stack 205 (exposed by gate trenches 275) are selectively removed from channel regions 244, thereby forming suspended semiconductor layers 215' in channel regions 244. In the depicted embodiment, an etching process selectively etches semiconductor layers 210 with minimal (to no) etching of semiconductor layers 215 and, in some embodiments, minimal (to no) etching of gate spacers 247 and/or inner spacers 255. Various etching parameters can be tuned to achieve selective etching of semiconductor layers 210, such as etchant composition, etching temperature, etching solution concentration, etching time, etching pressure, source power, RF bias voltage, RF bias power, etchant flow rate, other suitable etching parameters, or combinations thereof. For example, an etchant is selected for the etching process that etches the material of semiconductor layers 210 (in the depicted embodiment, silicon germanium) at a higher rate than the material of semiconductor layers 215 (in the depicted embodiment, silicon) (i.e., the etchant has a high etch selectivity with respect to the material of semiconductor layers 210). In some embodiments where the cladding layer 220 is present, the etching process also selectively removes the cladding layer 220. The etching process is a dry etching process, a wet etching process, other suitable etching process, or combinations thereof. In some embodiments, a dry etching process (such as an RIE process) utilizes a fluorine-containing gas (for example, $SF_6$) to selectively etch semiconductor layers 210. In some embodiments, a ratio of the fluorine-containing gas to an oxygen-containing gas (for example, $O_2$), an etching temperature, and/or an RF power may be tuned to selectively etch silicon germanium or silicon. In some embodiments, a wet etching process utilizes an etching solution that includes ammonium hydroxide ($NH_4OH$) and water ($H_2O$) to selectively etch semiconductor layers 210. In some embodiments, a chemical vapor phase etching process using hydrochloric acid (HCl) selectively etches semiconductor layers 210.

At least one suspended semiconductor layer 215' is thus exposed in the first gate region 240-1 and the second gate region 240-2 by gate trenches 275. In the depicted embodiment, each of the first gate region 240-1 and the second gate region 240-2 includes four suspended semiconductor layers 215' vertically stacked that will provide four channels through which current will flow between respective epitaxial source/drain features (epitaxial source/drain features 260A or epitaxial source/drain features 260B) during operation of the GAA transistors. Suspended semiconductor layers 215' are thus referred to as channel layers 215' hereinafter. Channel layers 215' in the first gate region 240-1 are separated by gaps 277A, and channel layers 215' in the second gate region 240-2 are separated by gaps 277B. Channel layers 215' in the first gate regions 240-1 are also separated from substrate 202 by gaps 277A, and channel layers 215' in the second gate region 240-2 are also separated from substrate 202 by gaps 277B. A spacing s1 is defined between channel layers 215' along the z-direction in the first gate region 240-1, and a spacing s2 is defined between channel layers 215' along the z-direction in the second gate region 240-2. Spacing s1 and spacing s2 correspond with a width of gaps 277A and gaps 277B, respectively. In the depicted embodiment, spacing s1 is about equal to s2, though the present disclosure contemplates embodiments where spacing s1 is different than spacing s2. In some embodiments, spacing s1 and spacing s2 are both about equal to thickness t1 of semiconductor layers 210. Further, channel layers 215' in the first gate region 240-1 have a length l1 along the x-direction and a width w1 along the y-direction, and channel layers 215' in the second gate region 240-2 have a length l2 along the y-direction and a width w2 along the x-direction. In the depicted embodiment, length l1 is about equal to length l2, and width w1 is about equal to width w2, though the present disclosure contemplates embodiments where length l1 is different than length l2 and/or width w1 is different than width w2. In some embodiments, length l1 and/or length l2 is about 10 nm to about 50 nm. In some embodiments, width w1 and/or width w2 is about 4 nm to about 10 nm. In some embodiments, each channel layer 215' has nanometer-sized dimensions and can be referred to as a "nanowire," which generally refers to a channel layer suspended in a manner that will allow a metal gate to physically contact at least two sides of the channel layer, and in GAA transistors, will allow the metal gate to physically contact at least four sides of the channel layer (i.e., surround the channel layer). In such embodiments, a vertical stack of suspended channel layers can be referred to as a nanostructure, and the process depicted in FIGS. 10A-10D can be referred to as a channel-release process. In some embodiments, after removing semiconductor layers 210, an etching process is performed to modify a profile of channel layers 215' to achieve desired dimensions and/or desired shapes (e.g., cylindrical-shaped (e.g., nanowire), rectangular-shaped (e.g., nanobar), sheet-shaped (e.g., nanosheet), etc.). The present disclosure further contemplates embodiments where the channel layers 215' (nanowires) have sub-nanometer dimensions depending on design requirements of multigate device 200.

Turning to FIGS. 11A-11D, gate stacks 360A and 360B are formed over multigate device 200. The formation of the gate stacks includes deposition and planarization process, such as CMP. The gate stacks 360A and 360B may be collectively formed or alternatively, separately formed, depending on the type of GAA transistors, such as n-type GAA transistors or p-type GAA transistors. Accordingly, the gate stacks 360A and 360B may have the same compositions or alternatively different compositions, such as different work function metal layers (as described below). Each of the gate stacks 360A and 360B includes a gate dielectric layer and a gate electrode disposed on the gate dielectric layer. In some embodiments, the gate dielectric layer includes an interfacial layer 280 and a high-k dielectric layer disposed on the interfacial layer 280. The gate electrode may include one or more conductive materials, such as a capping layer, a work function metal layer, a blocking layer, a metal fill layer, and/or other proper conductive material layers. In some embodiments, the gate electrode includes a work function layer (such as 300 for the gate stack 360A or 310 for the gate stack 360B) and a metal fill layer 350 disposed on the work function metal layer. The work function layers 300 and 310 may be same or different and may be an n-type work function layer or a p-type work function layer, depending the types of the corresponding GAA transistors.

In the depicted embodiment, the gate dielectric layer includes an interfacial layer 280 and a high-k dielectric layer 282, where interfacial layer 280 is disposed between the high-k dielectric layer 282 and channel layers 215'. In furtherance of the depicted embodiment, interfacial layer 280 and high-k dielectric layer 282 partially fill gaps 277A between channel layers 215' and between channel layers 215' and substrate 202 in the first gate region 240-1 and partially fill gaps 277B between channel layers 215' and between channel layers 215' and substrate 202 in the second gate region 240-2. In some embodiments, interfacial layer 280 and/or high-k dielectric layer 282 are also disposed on substrate 202, isolation features 230, and/or gate spacers 247. Interfacial layer 280 includes a dielectric material, such as $SiO_2$, HfSiO, SiON, other silicon-comprising dielectric material, other suitable dielectric material, or combinations thereof. High-k dielectric layer 282 includes a high-k dielectric material, such as $HfO_2$, HfSiO, $HfSiO_4$, HfSION, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide (k≈3.9). Interfacial layer 280 is formed by any of the processes described herein, such as thermal oxidation, chemical oxidation, ALD, CVD, other suitable process, or combinations thereof. In some embodiments, interfacial layer 280 has a thickness of about 0.5 nm to about 3 nm. High-k dielectric layer 282 is formed by any of the processes described herein, such as ALD, CVD, PVD, oxidation-based deposition process, other suitable process, or combinations thereof. In some embodiments, high-k dielectric layer 282 has a thickness of about 1 nm to about 2 nm.

The work function layer (300 or 310) is formed over multigate device 200, particularly over high-k dielectric layer 282. For example, an ALD process conformally deposits the work function layer on high-k dielectric layer 282, such that the work function layer has a substantially uniform thickness and partially fills gate trenches 275. The work function layer can be formed using another suitable deposition process, such as CVD, PVD, HDPCVD, MOCVD, RPCVD, PECVD, LPCVD, ALCVD, APCVD, spin coating, plating, other deposition process, or combinations thereof. For example, the work function layer is disposed along sidewalls, tops, and bottoms of channel layers 215'. A thickness of the work function layer is configured to at least partially fill gaps (277A or 277B) between channel layers 215' and between channel layers 215' and substrate 202 (and, in some embodiments, without filling gate trenches 275 along the gate length direction (here, along the y-direction)). In some embodiments, the work function layer has a thickness of about 1 nm to about 10 nm. In some embodiments, p-type work function layer includes any suitable p-type work function material, such as TiN, TaN, TaSN, Ru, Mo, Al, WN, WCN, $ZrSi_2$, $MoSi_2$, $TaSi_2$, $NiSi_2$, other p-type work function material, or combinations thereof. In the depicted embodiment, p-type work function layer includes titanium and nitrogen, such as TiN. In some embodiments, the n-type work function layer includes any suitable n-type work function material, such as Ti, Al, Ag, Mn, Zr, TiAl, TiAlC, TiAlSiC, TaC, TaCN, TaSiN, TaAl, TaAlC, TaSiAlC, TiAlN, other n-type work function material, or combinations thereof. In the depicted embodiment, n-type work function layer includes aluminum.

A metal fill (or bulk) layer 350 is formed over multigate device 200, particularly over the work function layer 300 in the first gate regions 240-1 and over the work function layer 310 in the second gate regions 240-2. For example, a CVD process or a PVD process deposits metal fill layer 350 such that metal fill layer 350 fills any remaining portion of gate trenches 275, including any remaining portions of gaps (277A or 277B) in the gate regions 240-1 and 240-2. Metal fill layer 350 includes a suitable conductive material, such as Al, W, and/or Cu. Metal fill layer 350 may additionally or collectively include other metals, metal oxides, metal nitrides, other suitable materials, or combinations thereof. Alternatively, metal fill layer 350 is formed using another suitable deposition process, such as ALD, CVD, PVD, HDPCVD, MOCVD, RPCVD, PECVD, LPCVD, ALCVD, APCVD, spin coating, plating, other deposition process, or combinations thereof. In the depicted embodiment, the metal fill layer 350 is formed by PVD to form a seed layer and followed by plating to completely form the metal fill layer.

A planarization process is performed to remove excess gate materials from multigate device 200. For example, a CMP process is performed until a top surface of ILD layer 270 is reached (exposed), such that a top surface of gate structures 240 are substantially planar with a top surface of ILD layer 270 after the CMP process. Accordingly, multigate device 200 includes first GAA transistors having a gate stack 360A wrapping respective channel layers 215', such that gate stack 360A is disposed between respective epitaxial source/drain features 260A, and second GAA transistor having metal gate stacks 360B wrapping respective channel layers 215', such that metal gates 360B are disposed between respective epitaxial source/drain features 260B.

Other fabrication processes may be applied on the frontside 202FS of the workpiece 200 and may implemented before, during, or after the processes described above, such as various processing steps to form an interconnect structure over the GAA transistors from the frontside of substrate 202 to electrically connects various circuit components including the first GAA transistors in the first region 202A and the second GAA transistors in the second region 202B. The interconnect structure includes metal lines distributed in multiple metal layers (such as $1^{st}$ metal layer, $2^{nd}$ metal layer, $3^{rd}$ metal layer, and etc. from the bottom up to the top metal layer) to provide horizontal routing and contact features (between the substrate and the first metal layer), and via features (between the metal layers) to provide vertical routing. The multigate device 200 also includes other components, such as other conductive features (such as redistribution layer or RDL), passivation layer(s) to provide sealing effect, and/or bonding structures to provide an interface between the multigate device 200 and a circuit board (such as a printed circuit board) to be formed on the interconnect structure. Various operations described above are performed on the frontside 202FS of the substrate 202. The subsequent operations are applied to the backside 202BS of the workpiece 200 to be described below. Prior to proceeding to various operations on the backside 202BS, other operations may apply, such as bonding another substrate to the frontside 202FS of the workpiece 200.

Referring to FIGS. 12A-12D, the substrate 202 is thinned down from the backside 202BS. In some embodiments, at least some of the source/drain features 260A and 260B and the gate stacks 360A and 360B are exposed from the backside 202BS of the substrate 202 after the thinning-down process. The thinning-down process may include etching, grinding, CMP, other suitable polishing process, or a combination thereof.

Still referring to FIGS. 12A-12D, a patterning process is applied to the workpiece 200 such that the channel layers 215' and the gate stack 360B in the second region 202B are reduced while the channel layers 215' and the gate stack 360A in the first region 202A remain unchanged. Particularly, the number of channel layers 215' is reduced. For example, the original number of the channel layers 215' in both the first region 202A and the second region 202B is a same number N. After the patterning process, the number of the channel layers 215' in the second region 202B is reduced to N-M while the number of the channel layers 215' in the first region 202A remain as N. Both N and M are integers. N can be any proper integer, such as N=3, 4, 5, 6 or etc. M is an integer less than N, such as M=1, 2, 3, . . . and (N−1). In the depicted example illustrated in FIGS. 12A-12D, N=4 and M=1. In this case, each of the GAA transistors in the first region 202A includes 4 channel layers 215' while each of the GAA transistors in the second region 202B includes 3 channel layers 215'. Accordingly, each of the gate stacks 360B in the second region 202B is recessed from the backside 202BS as well, such that the height of the gate stacks 360B is less than the height of the gate stacks 360A, as illustrated in FIGS. 12A-12D. Portions of the inner spacers 255 below the removed channel layer(s) 215' in the second region 202B may be removed as well or alternatively remain as the original. After the channel reduction patterning process, a dielectric layer 370 may be formed on the backside of the workpiece to protect various features (channel layers, gate stacks and such as source/drain features), as illustrated in FIGS. 12A-12D. The dielectric layer 370 may include one or more dielectric material deposited on the backside of the workpiece 200 and may be additionally planarized, such as CMP. The dielectric layer 370 may include silicon oxide, silicon nitride, silicon oxynitride, low-k dielectric material, other suitable dielectric material or a combination thereof. The deposition process of the dielectric layer 370 may be CVD, FCVD, spin-on coating and curing, other suitable deposition, or a combination thereof. The backside of the workpiece 200 may include other features, such as power lines, contact features and other conductive features to be described below according to various embodiments.

In the multigate device 200, even the first GAA transistors in the first region 202A and the second GAA transistors in the second region 202B have different numbers of the channel layers 215' but the topmost channel layer 215' in the first region 202A and the topmost channel layer 215' in the second region 202B have top surfaces being coplanar. Furthermore, even the gate stack 360A in the first region 202A and the gate stack 360B in the second region 202B have different heights but the top surface of the gate stack 360A in the first region 202A and the top surface of the gate stack 360B in the second region 202B are coplanar. This will benefit the various processes (such as those described in the block 102 through the block 120 of the method 100) applied to the frontside 202FS of the workpiece 200 since the front surface of the workpiece 200 has a more planar surface and therefore achieves uniform results. In contrary, the bottommost channel layer 215' in the first region 202A and the bottommost channel layer 215' in the second region 202B are at different levels. Furthermore, the bottom surface of the gate stack 360A in the first region 202A and the bottom surface of the gate stack 360B in the second region 202B are at different levels. The multigate device 200 includes two or more regions with GAA transistors having different numbers of the channel layers and different gate heights. The method (block 124 in FIG. 1) to reduce the number of channel layers in disclosed structure are further described below according various embodiments.

FIG. 13 is a flowchart of a method 124 to reduce the channel layers and gate stack from the backside of the workpiece according to some embodiments. FIGS. 14A-21A, FIGS. 14B-21B, FIGS. 14C-21C, and FIGS. 14D-21D are fragmentary diagrammatic views of a multigate device 200, in portion or entirety, at various fabrication stages (such as those associated with method 124 in FIG. 13) according to various aspects of the present disclosure. In particular, FIGS. 14A-21A are top views of multigate device 200 in an X-Y plane; FIGS. 14B-21B are diagrammatic cross-sectional views of multigate device 200 in an X-Z plane along lines B-B' respectively of FIGS. 14A-21A, FIGS. 14C-21C are diagrammatic cross-sectional views of multigate device 200 in a Y-Z plane along lines C-C' respectively of FIGS. 14A-21A; and FIGS. 14D-21D are diagrammatic cross-sectional views of multigate device 200 in the Y-Z plane along lines D-D' respectively of FIGS. 14A-21A.

The method 124 of FIG. 13 details various processing steps to reduce the channel layers and gate stack from the backside of the workpiece according to some embodiments, as the block 124 of the method 100 in FIG. 1. In this case, the channel layers 215' and the gate stacks (360A and 360B) are not exposed after the thinning-down process at block 122. Instead, the sacrificial semiconductor layer 372 underlying the source/drain features is exposed. At block 126, a selective etching process is applied to the workpiece 200 from the backside 202BS such that portions of the fins 103 underlying the gate stacks are removed. At block 128, a patterned protecting layer is formed on backside of the workpiece within the first region 202A while the second region 202B is exposed from the backside. At block 130, an etching process is applied to reduce the number of the channel layers 215' and the gate stack 360B within the second region 202B. At block 132, the patterned protecting layer may be removed from the backside of the workpiece 200. At block 134, a dielectric layer is formed on the backside of the workpiece 200 to protect the channel layers 215 and the gate stacks 360A and 360B. At block 136, the backside conductive features (or backside power rails) are formed from the backside of the workpiece 200 so to land on bottom surfaces of a subset of the source/drain features 260A and 260B.

Referring to FIGS. 14A-14D, after the thinning-down process at block 122, the source/drain features 260A and 260B are not exposed but the semiconductor material layer 372 is exposed from the backside 202BS of the workpiece 200. In the depicted embodiment, the (sacrificial) semiconductor material layer 372 with a composition different from that of the substrate 202 is formed below the source/drain features (260A and 260B) to provide etch selectivity. For example, the semiconductor layer 372 includes silicon germanium while the substrate 202 include silicon (as described in FIGS. 5A-5D and 7A-7D). The semiconductor layer 372 can be formed during the processes to form the source/drain features. In the depicted embodiment of the method 100, the block 106 to form source/drain trenches 250 is modified to form deeper trenches 250 in the source/drain regions, as illustrated in FIGS. 14A-14D; and the block 110 includes epitaxially growing a silicon germanium layer 372 in the deeper source/drain trenches 250 and then epitaxially growing the source/drain features 260A and 260B on the silicon germanium layer 372 in the source/drain trenches 250, as illustrated in FIGS. 15A-15D.

Referring to FIGS. 16A-16D, after the thinning-down process at block 122, the semiconductor material layer 372 is exposed from the backside of the workpiece 200.

Referring to FIGS. 17A-17D, a selective etching process is applied to remove the bulk silicon in the fins 103 while the semiconductor layer 372 remains. For examples, a solution including $HNO_3$, $H_2O$, and hydro-fluoride (HF) is used to selectively etch silicon. In another example, a KOH solution is used to selectively etch silicon.

Referring to FIGS. 18A-18D, a patterned protecting layer 374 is formed to cover the first region 202A while the second region 202B is exposed within an opening of the patterned protecting layer 374. In some embodiments, the patterned protecting layer 374 is a patterned photoresist layer formed by a lithography process. In some embodiments, the patterned protecting layer 374 includes other one or more material different from the gate stack 360B and the channel layers 215' so that the subsequent etching process has no (or minimal) etching effect to the protecting layer. In furtherance of the embodiments, the protecting layer 374 includes a dielectric layer, such as silicon oxide, silicon nitride, a metal oxide (such as titanium oxide), other dielectric material or a combination thereof. In this case, the protecting layer 374 is formed by deposition and patterning process that further includes a lithography process and etching. The deposition process includes CVD, FCVD, other suitable deposition method or a combination thereof.

Referring to FIGS. 19A-19D, the channel layers 215' and the gate stacks 360B in the second region 202B are reduced by etching. The etching process is designed with etchant(s) to be selective with no or minimal etching effect to the protecting layer 374. The etching process may include multiple etching steps with respective etchants to selectively etch various materials of the channel layers 215' and the gate stacks 360B including the gate dielectric materials and gate electrode materials. In the depicted embodiment, the number of the channel layers 215 is reduced by 1 or M=1 and N−M=3. However, the present disclosure contemplates embodiments where M is any integer from 1 to N−1. In the present embodiment, the inner spacers 255 below the reduced channel layer(s) 215' are removed as well. Alternatively, the inner spacers 255 in the second region 202B may remain unchanged after the channel reduction. The protecting layer 374 may be removed by stripping if it is a patterned photoresist layer or by etching if it is other material. Alternatively, it may remain if it is not photoresist.

Referring to FIGS. 20A-20D, a dielectric layer 376 is formed on the backside of the workpiece 200, thereby covering the channel layers 215' and the gate stacks 360A and 360B. The dielectric layer 376 may be formed by deposition and CMP. In some embodiments, the dielectric layer 376 includes a dielectric layer, such as silicon oxide, silicon nitride, a metal oxide, other dielectric material or a combination thereof. The deposition process includes CVD, FCVD, other suitable deposition method or a combination thereof.

Referring to FIGS. 21A-21D, in some embodiments, backside conductive features 378 are formed to electrically connect a subset of the source/drain features 260A and 260B from the backside while the rest source/drain features 260A and 260B are electrically connected to conductive features 380 from the frontside. The backside conductive features 378 reduce the conductive features in the frontside and provide more freedom to metal routing in the frontside, therefore enhancing the packing density, especially for GAA devices in advance technology nodes.

The conductive features 380 are contact features connected to source/drain features and are landing on top surfaces of the source/drain features from the frontside, which can be formed by processes to form an interconnect structure (including contact features, via features and metal lines) at block 120. Any suitable method can be used to form the conductive features 380. For example, the ILD layer 270 is patterned to form contact holes by lithography process and etching. One or more conductive material is filled in the contact holes and a CMP process may be applied thereafter to remove excessive conductive material and planarize the top surface of the workpiece 200. In some embodiments, the conductive features 380 includes a silicide layer directly formed on the top surfaces of the source/drain features, and a fill metal, such as tungsten, cobalt, nickel, or copper, deposited on the silicide layer to fill in the contact holes. In some alternative embodiments, a barrier layer, such as titanium and titanium nitride, or tantalum and tantalum nitride, is formed on the sidewalls of the contact holes after the silicide layer and before the fill metal. The barrier layer is inserted between the silicide layer and the fill metal and separate the fill metal from the ILD layer 270 to prevent inter-diffusion. In some examples, contact features include a conductive material, such as metal. Metals include aluminum, aluminum alloy (such as aluminum/silicon/copper alloy), copper, copper alloy, titanium, titanium nitride, tantalum, tantalum nitride, tungsten, polysilicon, metal silicide, other suitable metals, or combinations thereof. The metal silicide may include nickel silicide, cobalt silicide, tungsten silicide, tantalum silicide, titanium silicide, platinum silicide, erbium silicide, palladium silicide, or combinations thereof.

In the present embodiment, by removing the portions of the inner spacers 255 and the edge portions of the reduced channel layers 215' (compared with the structure in FIGS. 24A-24D), the dielectric constant (k value) of the materials between the source/drain features are decreased and parasitic capacitance between the source/drain features (and between the gate stacks) are reduced.

The conductive features 378 are similar to the conductive features 380 in term of composition and structure. However, the conductive features 380 are formed on the backside 202BS of the workpiece. In some embodiments, the conductive features 378 are formed by a procedure that includes patterning, deposition and CMP. In a depicted embodiment, the procedure includes performing an etching process to selectively remove the semiconductor layer 372; forming a dielectric layer 382 by deposition and patterning, so that the dielectric layer includes openings aligned with areas where the conductive features 378 to be formed while other areas are covered thereby; and forming the conductive features 378 by deposition, and additionally CMP. The CMP process also removes excessive portions of the conductive features 378 and the dielectric layer 382 and planarize the backside surface of the workpiece 200. The dielectric layer 382 may include any suitable dielectric materials, such as silicon oxide, silicon nitride, metal oxide, other suitable dielectric material, or a combination thereof. The dielectric layer 382 may have same composition of the dielectric layer 376, or alternative different composition. Similar to the frontside conductive features 380, the backside conductive features 378 may also include multiple conductive layers, such as a silicide layer and a fill metal layer, or alternatively, a silicide layer, a barrier layer, and a fill metal layer. Particularly, the silicide layer directly contacts the bottom surface of the source/drain features. The barrier layer is inserted between the silicide layer and the fill metal and separate the fill metal layer from the surrounding dielectric layer to prevent inter-diffusion.

Figure 22:
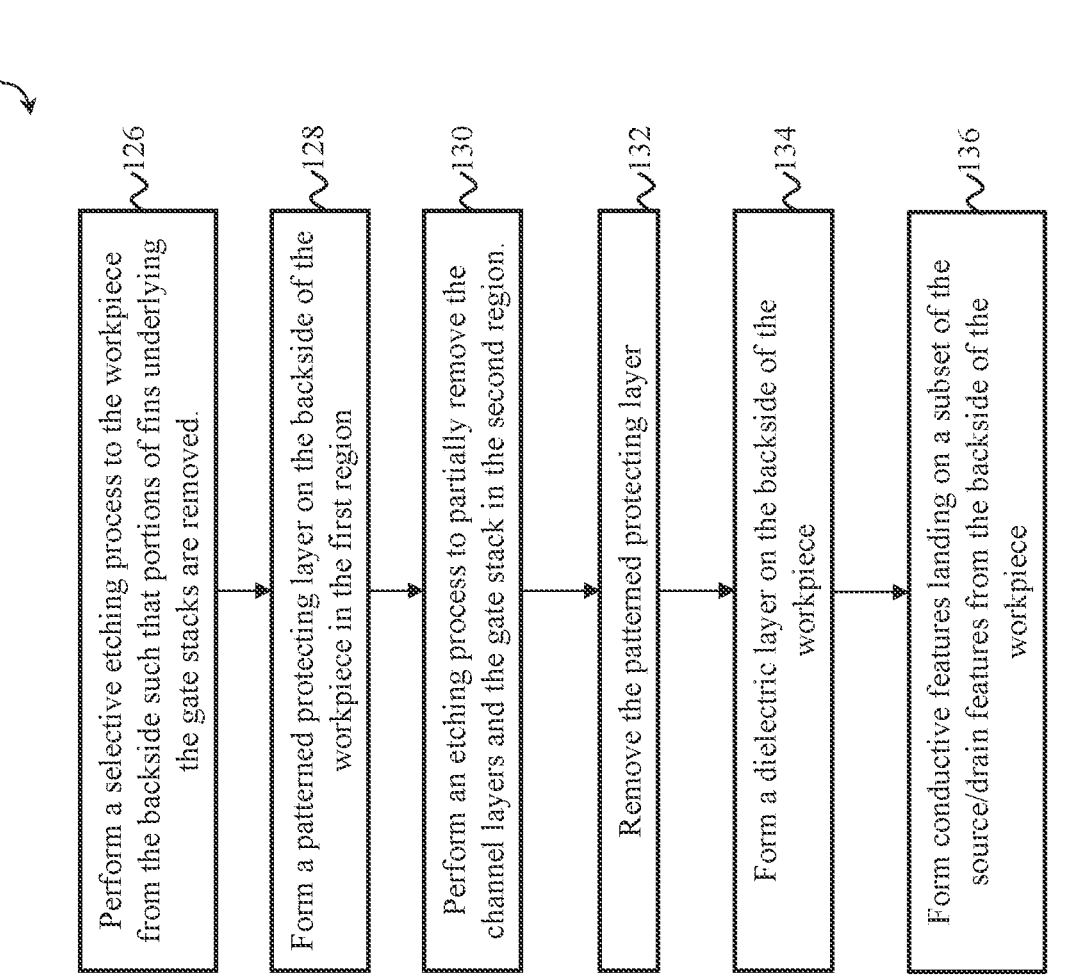
FIG. 22 is a flowchart of a method for fabricating a multigate device according to various aspects of the present disclosure.
Figures 23A, 23B, 23C, 23D:
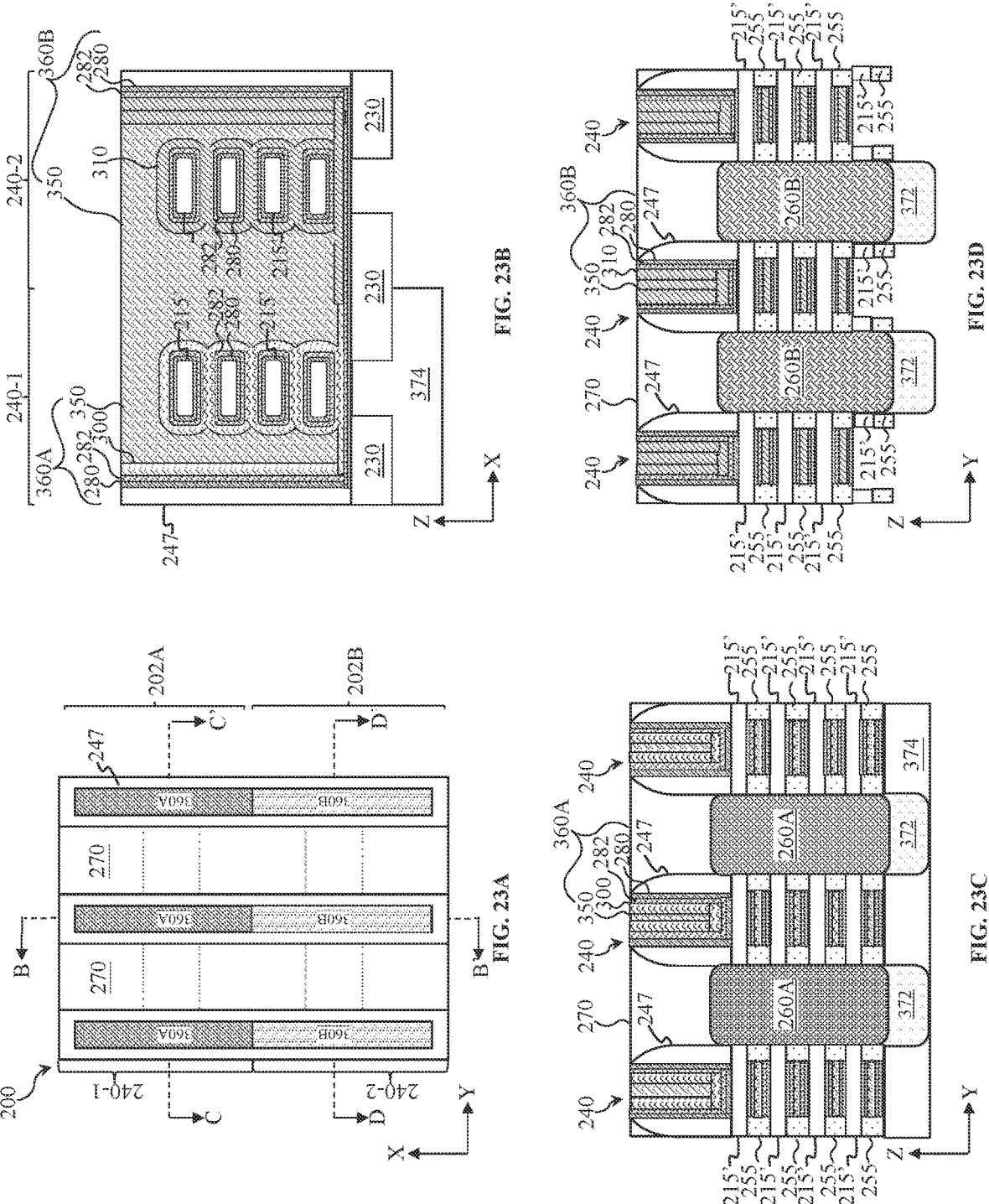

FIG. 22 is a flowchart of a method 124 to reduce the channel layers and gate stack from the backside of the workpiece 200 according to some embodiments. The method 124 of FIG. 22 is similar to the method 124 of FIG. 13 except for the block 130. At block 130 only portions of the channel layers 215' and the gate stack in the second region 202B are removed but the inner spacers 255 remain and keep unchanged, as illustrated in FIGS. 21A-21D. The structure of the multigate device 200 after the channel reduction is illustrated in FIGS. 22A-22D. The detailed descriptions are omitted for brevity.

FIGS. 23A-24A, FIGS. 23B-24B, FIGS. 23C-24C, and FIGS. 23D-24D are fragmentary diagrammatic views of a multigate device 200, in portion or entirety, at various fabrication stages (such as those associated with method 124 in FIG. 22) according to various aspects of the present disclosure. In particular, FIGS. 23A-24A are top views of multigate device 200 in an X-Y plane; FIGS. 23B-24B are diagrammatic cross-sectional views of multigate device 200 in an X-Z plane along lines B-B' respectively of FIGS.

23A-24A, FIGS. 23C-24C are diagrammatic cross-sectional views of multigate device 200 in a Y-Z plane along lines C-C' respectively of FIGS. 23A-24A; and FIGS. 23D-24D are diagrammatic cross-sectional views of multigate device 200 in the Y-Z plane along lines D-D' respectively of FIGS. 23A-24A.

Referring to FIGS. 23A-23D, portions of the channel layers 215' and the gate stack 360B in the second region 202B are removed by an etching process but the inner spacers 255 are not etched and keep unchanged. Accordingly, the removed channel layers 215' (the bottommost channel layer 215' in the depicted embodiment) are only partially removed, and the edge portions aligned with the inner spacers 255 remain on the sidewalls of the source/drain features 260B.

Referring to FIGS. 24A-24D, the dielectric layer 376 is formed on the backside of the workpiece 200 to cover and protect the channel layers 215' and the gate stack 360B. Particularly, the dielectric layer 376 includes various segments each having a T-shape inserted into the gaps between the source/drain features 260B.

Figures 24A, 24B, 24C, 24D:
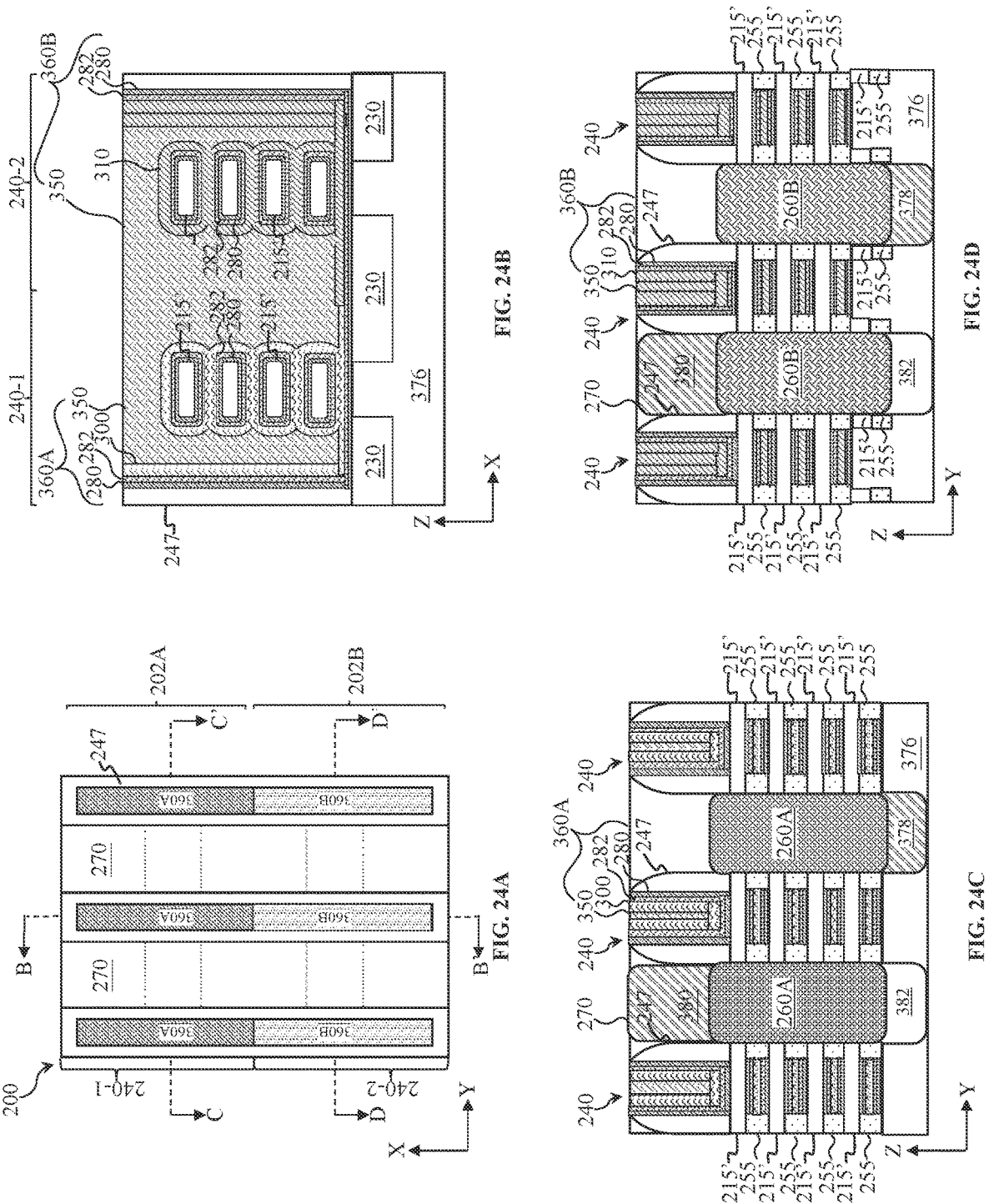
Figures 26A, 26B, 26C, 26D:
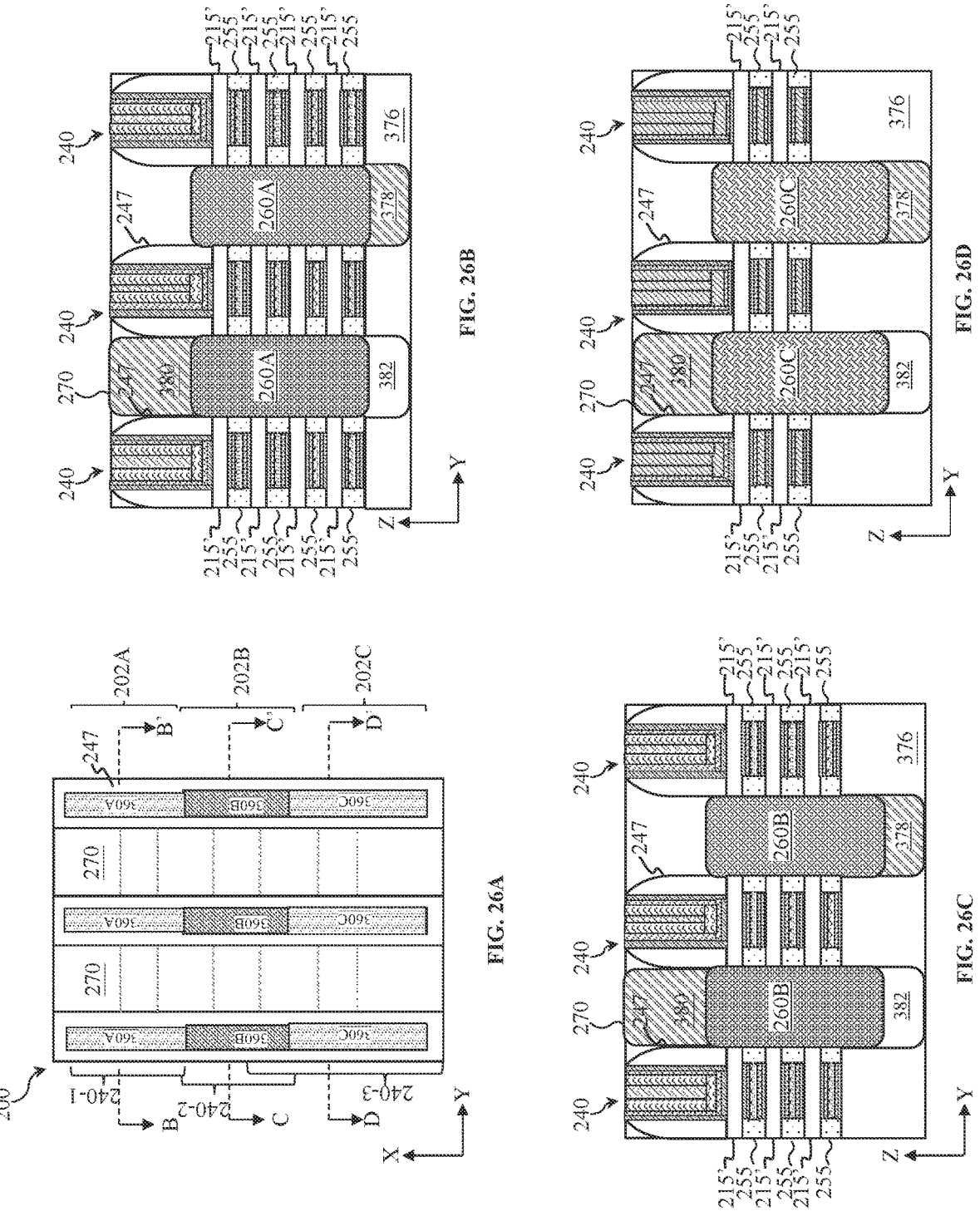
FIGS. 26A, 26B, 26C and 26D are fragmentary diagrammatic views of a multigate device, in portion or entirety, at various fabrication stages (such as those associated with the method in FIG. 25) according to various aspects of the present disclosure.

FIG. 25 is a flowchart of a method 124 to reduce the channel layers and gate stack from the backside of the workpiece 200 according to some embodiments. FIGS. 26A, 26B, 26C and 26D are fragmentary diagrammatic views of a multigate device 200, in portion or entirety, at various fabrication stages (such as those associated with method 124 in FIG. 25) according to various aspects of the present disclosure. In particular, FIG. 26A is a top view of multigate device 200 in an X-Y plane; FIG. 26B is a diagrammatic cross-sectional view of multigate device 200 in an Y-Z plane along lines B-B' of FIG. 26A, FIG. 26C is a diagrammatic cross-sectional view of multigate device 200 in a Y-Z plane along lines C-C' of FIG. 26A; and FIG. 24D is a diagrammatic cross-sectional view of multigate device 200 in the Y-Z plane along lines D-D' of FIG. 26A.

The method 124 of FIG. 25 is similar to the method 124 of FIG. 13 except for the method 124 of FIG. 25 includes various operations applied to three different circuit regions: a first region 202A, a second region 202B and a third region 202C, as illustrated in FIGS. 26A-26D. In this case, the channel reduction processes are applied to the second region 202B and the third region 202C separately or collectively, such that the number channel layers 215' in the second region is reduced to N−M1 and the number channel layers 215' in the third region is reduced to N−M2, in which M1 and M2 are integers ranging between 1 and N−1, and M1 and M2 are not equal. For example, M1=1 and M2=2. In the method 124, the blocks 128, 130 and 132 are repeated twice. the blocks 128, 130 and 132 are repeated more than twice.

In the depicted embodiment, at block 128, a patterned protecting layer is formed to cover the first region 202A while the second region 202B and the third region 202C are exposed within the openings of the protecting layer. At block 130, the channel layers 215', the gate stack and the inner spacers in the second region 202B and the third region 202C are reduced by an etching process, such as reduced by 1. At block 132, the protecting layer may be removed by stripping or etching.

Thereafter, the method 124 goes back to block 128, in which a patterned protecting layer is formed to cover the first region 202A and the second region 202B while the third region 202C is exposed within the opening of the protecting layer. At block 130, the channel layers 215', the gate stack and the inner spacers in the third region 202C are reduced by an etching process, such as reduced by 1. At block 132, the protecting layer may be removed by stripping or etching.

Accordingly, the GAA transistors in the first region 202A include N channel layers 215', the GAA transistors in the second region 202B include N-M1 channel layers 215', and the GAA transistors in the third region 202C include N-M2 channel layers 215'. In the embodiment illustrated in FIGS. 24A-24D, N=4, M1=1, and M2=2.

Figures 28A, 28B, 28C, 28D:
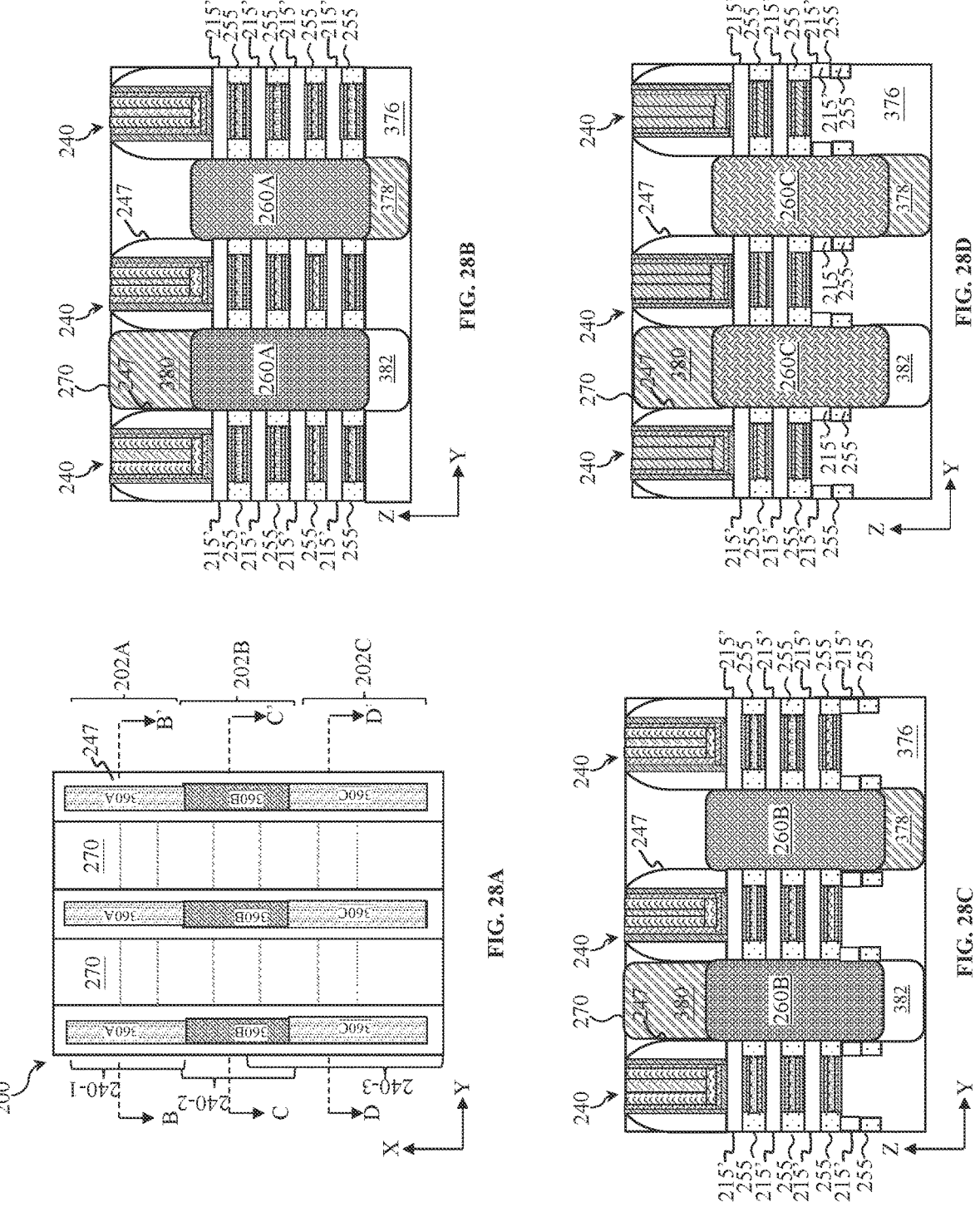
FIGS. 28A, 28B, 28C and 28D are fragmentary diagrammatic views of a multigate device, in portion or entirety, at various fabrication stages (such as those associated with the method in FIG. 27) according to various aspects of the present disclosure.

FIG. 27 is a flowchart of a method 124 to reduce the channel layers and gate stack from the backside of the workpiece 200 according to some embodiments. FIGS. 28A, 28B, 28C and 28D are fragmentary diagrammatic views of a multigate device 200, in portion or entirety, at various fabrication stages (such as those associated with method 124 in FIG. 27) according to various aspects of the present disclosure. In particular, FIG. 28A is a top view of multigate device 200 in an X-Y plane; FIG. 28B is a diagrammatic cross-sectional view of multigate device 200 in an Y-Z plane along lines B-B' of FIG. 28A, FIG. 28C is a diagrammatic cross-sectional view of multigate device 200 in a Y-Z plane along lines C-C' of FIG. 28A; and FIG. 28D is a diagrammatic cross-sectional view of multigate device 200 in the Y-Z plane along lines D-D' of FIG. 28A.

The method 124 of FIG. 27 is similar to the method 124 of FIG. 25 except for the inner spacers 255 are not reduced at block 130. At block 130, only portions of the channel layers 215' and the gate stack in the second region 202B and the third region 202C are removed but the inner spacers 255 remain and keep unchanged, as illustrated in FIGS. 28A-28D. The detailed descriptions are omitted for brevity.

The present disclosure provides for many different embodiments. An exemplary method forming GAA transistors includes channel reduction process where the number of channel layers in some circuit region(s) are reduced from the backside of the workpiece. Thus, GAA transistors in different circuit regions have different numbers of the channel layers. Since the channel layers are reduced from the backside of the workpiece, in the frontside of the workpiece, the gate stacks and the channel layers have same (or coplanar) top surfaces. This will benefit the various processes applied to the frontside of the workpiece since the front surface of the workpiece has a more planar surface and therefore achieves uniform results. Furthermore, the disclosed structure and method are also compatible with other fabrication technologies without reducing the circuit packing density and power efficiency.

The present disclosure provides multigate devices and methods for fabricating such disclosed herein. In one example aspect, an exemplary multigate device includes a first FET disposed in a first region; and a second FET disposed in a second region of a substrate. The first FET includes first channel layers disposed over the substrate, and a first gate stack disposed on the first channel layers and extended to warp around each of the first channel layers. The second FET includes second channel layers disposed over the substrate, and a second gate stack disposed on the second channel layers and extended to warp around each of the second channel layers. A number of the first channel layers is greater than a number of the second channel layers. A bottommost one of the first channel layers is below a bottommost one of the second channel layers.

In another example aspect, the multigate device includes a substrate having a first, second, and third regions; a first field effect transistor (FET) disposed in the first region, wherein the first FET includes first channel layers disposed over the substrate, and a first gate stack disposed on the first channel layers and extended to warp around each of the first channel layers; a second FET disposed in the second region, wherein the second FET includes second channel layers disposed over the substrate, and a second gate stack disposed on the second channel layers and extended to warp around each of the second channel layers; and a third FET disposed in a third region, wherein the third FET includes third channel layers disposed over the substrate, and a third gate stack disposed on the third channel layers and extended to warp around each of the third channel layers. A number of the first channel layers is greater than a number of the second channel layers. The number of the second channel layers is greater than a number of the third channel layers. A topmost surface of the first channel layers is coplanar with a topmost surface of the second channel layers and a topmost surface of the third channel layers.

In yet another example aspect, the method for making a multigate device includes providing a substrate having a frontside and a backside; forming a semiconductor stack on the frontside of the substrate, wherein the semiconductor stack includes a first semiconductor layers and a second semiconductor layers alternatively disposed, the first semiconductor layers and the second semiconductor layers are different in composition; selectively removing the first semiconductor layers; forming a first and a second gate stacks on the frontside of the substrate and extending to wrap around each of the second semiconductor layers, the first and second gate stacks being disposed in a first and second regions, respectively; and removing a subset of the second semiconductor layers from the backside within the second region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A multigate device comprising:
a backside dielectric layer having a first region and a second region;
a first field effect transistor (FET) disposed in the first region, wherein the first FET includes:
first channel layers disposed over the backside dielectric layer,
a first gate stack disposed on the first channel layers and extended to warp around each of the first channel layers,
first source/drain features interposed by the first gate stack and extended to contact the each of the first channel layers, and
a first dielectric feature disposed below and interfacing a bottom surface of one of the first source/drain features; and
a second FET disposed in the second region, wherein the second FET includes:
second channel layers disposed over the backside dielectric layer,
a second gate stack disposed on the second channel layers and extended to warp around each of the second channel layers,
second source/drain features interposed by the second gate stack and extended to contact the each of the second channel layers, silicon features disposed on sidewalls of the second source/drain features such that each of the silicon features is disposed between one of the second source/drain features and the backside dielectric layer, and
a second dielectric feature disposed below and interfacing a bottom surface of one of the second source/drain features,
wherein a number of the first channel layers is greater than a number of the second channel layers, and wherein a bottommost one of the first channel layers is below a bottommost one of the second channel layers,
wherein a top surface of one of the first source/drain features is level with a top surface of one of the second source/drain features,
wherein the backside dielectric layer interfaces bottom surfaces of the first gate stack and the second gate stack as well as sidewalls of the first dielectric feature and the second dielectric feature,
wherein the first source/drain features and the second source/drain features partially extend into the backside dielectric layer.

2. The multigate device of claim 1, wherein a topmost one of the first channel layers and a topmost one of the second channel layers include a common top surface and a common bottom surface.

3. The multigate device of claim 2, wherein a top surface of the first gate stack and a top surface of the second gate stack are coplanar.

4. The multigate device of claim 3, wherein the bottom surface of the first gate stack is below the bottom surface of the second gate stack.

5. The multigate device of claim 4, wherein
the first FET further includes first inner spacers disposed horizontally on opposite edges of the first gate stack;
the second FET further includes second inner spacers disposed horizontally on opposite edges of the second gate stack;
the first inner spacers extend up to a first level; and
the second inner spacers extend up to a second level matching the first level.

6. The multigate device of claim 5, wherein
bottommost spacers of the first inner spacers are below bottommost spacers of the second inner spacers;
the bottommost spacers of the first inner spacers includes a first bottom surface being coplanar with the bottom surface of the first gate stack; and
the bottommost spacers of the second inner spacers includes a second bottom surface being coplanar with the bottom surface of the second gate stack.

7. The multigate device of claim 6, wherein the second bottom surface is coplanar with the first bottom surface.

8. The multigate device of claim 1, further comprising a third FET disposed in a third region of the backside dielectric layer, wherein the third FET includes
third channel layers disposed over the backside dielectric layer,
a third gate stack disposed on the third channel layers and extended to warp around each of the third channel layers, and
third source/drain features interposed by the third gate stack and extended to contact the each of the third channel layers, wherein a number of the third channel layers is less than each of the number of the first channel layers and the number of the second channel layers.

9. The multigate device of claim 1, further comprising:

a first and second contact features connected to the first source/drain features, respectively; and a third and fourth contact features connected to the second source/drain features, respectively, wherein the first and third contact features are disposed over top surfaces of the first source/drain features and the second source/drain features, and the second and fourth contact features are disposed below bottom surfaces of the first source/drain features and the second source/drain features.

10. A multigate device comprising:

a backside dielectric layer having a first, second, and third regions;

a first field effect transistor (FET) disposed in the first region, wherein the first FET includes first channel layers disposed over the backside dielectric layer, a first gate stack disposed on the first channel layers and extended to warp around each of the first channel layers, first source/drain features interposed by the first gate stack and extended to contact the each of the first channel layers, and a first dielectric feature disposed below and interfacing a bottom surface of one of the first source/drain features;

a second FET disposed in the second region, wherein the second FET includes second channel layers disposed over the backside dielectric layer, a second gate stack disposed on the second channel layers and extended to warp around each of the second channel layers, second source/drain features interposed by the second gate stack and extended to contact the each of the second channel layers, and a second dielectric feature disposed below and interfacing a bottom surface of one of the second source/drain features; and a third FET disposed in a third region, wherein the third FET includes third channel layers disposed over the backside dielectric layer, a third gate stack disposed on the third channel layers and extended to warp around each of the third channel layers, third source/drain features interposed by the third gate stack and extended to contact the each of the third channel layers, and a third dielectric feature disposed below and interfacing a bottom surface of one of the third source/drain features, wherein a number of the first channel layers is greater than a number of the second channel layers, the number of the second channel layers is greater than a number of the third channel layers, and a topmost surface of the first channel layers is coplanar with a topmost surface of the second channel layers and a topmost surface of the third channel layers, a portion of the third gate stack is sandwiched directly between a bottommost one of the third channel layers and the backside dielectric layer, the backside dielectric layer interfaces bottom surfaces of the first gate stack, the second gate stack and the third gate stack, the second source/drain features and the third source/drain features partially extend into the backside dielectric layer, and bottom surfaces of the backside dielectric layer, the first dielectric feature, the second dielectric feature, and the third dielectric feature are coplanar.

11. The multigate device of claim 10, wherein a bottommost surface of the first channel layers is below a bottommost surface of the second channel layers, and the bottommost surface of the second channel layers is below a bottommost surface of the third channel layers.

12. The multigate device of claim 11, wherein a top surface of the first gate stack is coplanar with a top surface of the second gate stack and a top surface of the third gate stack.

13. The multigate device of claim 12, wherein the bottom surface of the first gate stack is below the bottom surface of the second gate stack, and the bottom surface of the second gate stack is below the bottom surface of the third gate stack.

14. The multigate device of claim 10, wherein the number of the first channel layers is N, N being an integer greater than 3, the number of the second channel layers is N−1, and the number of the third channel layers is N−2.

15. The multigate device of claim 10, wherein top surfaces of the first source/drain features, the second source/drain features and the third source/drain features are coplanar.

16. The multigate device of claim 10, further comprising:

a first and second contact features connected to the first source/drain features; and a third and fourth contact features connected to the second source/drain features, wherein the first and third contact features are disposed over top surfaces of the first source/drain features and the second source/drain features, and the second and fourth contact features are disposed below bottom surfaces of the first source/drain features and the second source/drain features.

17. The multigate device of claim 10, wherein the first FET further includes first inner spacers disposed horizontally on opposite edges of the first gate stack and contacting the first source/drain features, the second FET further includes second inner spacers disposed horizontally on opposite edges of the second gate stack and contacting the second source/drain features, the first inner spacers vertically span between a first top surface and a first bottom surface, the second inner spacers vertically span between a second top surface and a second bottom surface, the first top surface and the second top surface are coplanar, and the first bottom surface and the second bottom surface are coplanar.

18. A multigate device comprising:

a backside dielectric layer having a first region and a second region;

a first field effect transistor (FET) disposed in the first region, wherein the first FET includes:

first channel layers disposed over the backside dielectric layer, a first gate stack disposed on the first channel layers and extended to warp around each of the first channel layers, first source/drain features interposed by the first gate stack and extended to contact the each of the first channel layers, and a first dielectric feature disposed below and interfacing a bottom surface of one of the first source/drain features; and a second FET disposed in the second region, wherein the second FET includes:

second channel layers disposed over the backside dielectric layer, a second gate stack disposed on the second channel layers and extended to warp around each of the second channel layers, second source/drain features interposed by the second gate stack and extended to contact the each of the second channel layers, silicon features disposed on sidewalls of the second source/drain features such that each of the silicon features is disposed between one of the second source/drain features and the backside dielectric layer, and a second dielectric feature disposed below and interfacing a bottom surface of one of the second source/drain features, wherein a number of the first channel layers is greater than a number of the second channel layers, wherein a bottommost one of the first channel layers is below a bottommost one of the second channel layers, wherein a topmost one of the first channel layers and a topmost one of the second channel layers include a common top surface, and wherein a bottom surface of one of the first source/drain features and a bottom surface of one of the second source/drain features are coplanar, wherein the backside dielectric layer interfaces bottom surfaces of the first gate stack and the second gate stack as well as sidewalls of the first dielectric feature and the second dielectric feature, wherein the first source/drain features and the second source/drain features partially extend into the backside dielectric layer.

19. The multigate device of claim 18, wherein a top surface of the first gate stack and a top surface of the second gate stack are coplanar;

a bottom surface of the first gate stack is below a bottom surface of the second gate stack; and the topmost one of the first channel layers and the topmost one of the second channel layers include a common bottom surface.

20. The multigate device of claim 18, wherein the first FET further includes first inner spacers disposed horizontally on opposite edges of the first gate stack;

the second FET further includes second inner spacers disposed horizontally on opposite edges of the second gate stack;

the first inner spacers extend up to a first level; and the second inner spacers extend up to a second level matching the first level.

\* \* \* \* \*